United States Patent
Yang

(10) Patent No.: US 12,183,705 B2
(45) Date of Patent: Dec. 31, 2024

(54) SEMICONDUCTOR DEVICE STRUCTURE WITH COMPOSITE BOTTLE-SHAPED THROUGH SILICON VIA

(71) Applicant: NANYA TECHNOLOGY CORPORATION, New Taipei (TW)

(72) Inventor: Sheng-Hui Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/217,727

(22) Filed: Jul. 3, 2023

(65) Prior Publication Data
US 2023/0352434 A1 Nov. 2, 2023

Related U.S. Application Data

(62) Division of application No. 17/730,342, filed on Apr. 27, 2022.

(51) Int. Cl.
*H01L 23/00* (2006.01)

(52) U.S. Cl.
CPC .............. *H01L 24/24* (2013.01); *H01L 24/19* (2013.01); *H01L 24/20* (2013.01); *H01L 2224/215* (2013.01); *H01L 2224/24011* (2013.01); *H01L 2224/2405* (2013.01); *H01L 2224/24146* (2013.01)

(58) Field of Classification Search
CPC ............ H01L 21/76879; H01L 21/288; H01L 21/768; H01L 21/76895; H01L 21/76898; H01L 23/00; H01L 23/481; H01L 23/48; H01L 24/24; H01L 24/19; H01L 24/20; H01L 25/0657; H01L 25/065; H01L 25/0656; H01L 25/50; H01L 2224/215; H01L 2224/24011; H01L 2224/2405; H01L 2224/24146; H01L 2225/06527;
(Continued)

(56) References Cited

U.S. PATENT DOCUMENTS

| 7,741,226 B2 | 6/2010 | Andry et al. |
| 9,607,890 B1 | 3/2017 | Baloglu et al. |

(Continued)

FOREIGN PATENT DOCUMENTS

| JP | 2017005151 A | 1/2017 |
| TW | 201037809 A | 10/2010 |

(Continued)

OTHER PUBLICATIONS

Office Action dated Mar. 6, 2023 related to Taiwanese Application No. 111124077.

(Continued)

*Primary Examiner* — Nikolay K Yushin
(74) *Attorney, Agent, or Firm* — Xuan Zhang

(57) ABSTRACT

A semiconductor device structure includes a silicon layer disposed over a first semiconductor die, and a first mask layer disposed over the silicon layer. The semiconductor device structure also includes a second semiconductor die disposed over the first mask layer, and a through silicon via penetrating through the silicon layer and the first mask layer. A bottom surface of the through silicon via is greater than a top surface of the through silicon via, and the top surface of the through silicon via is greater than a cross-section of the through silicon via between and parallel to the top surface and the bottom surface of the through silicon via.

14 Claims, 23 Drawing Sheets

(58) Field of Classification Search
CPC . H01L 2225/06546; H01L 2225/06517; H01L 2225/0658
See application file for complete search history.

(56) References Cited

U.S. PATENT DOCUMENTS

| | | |
|---|---|---|
| 9,824,973 B2 | 11/2017 | Lee et al. |
| 11,295,981 B2 | 4/2022 | Hong et al. |
| 2007/0290300 A1 | 12/2007 | Kawakami |
| 2012/0001330 A1 | 1/2012 | Huisinga et al. |
| 2017/0053872 A1 | 2/2017 | Lee et al. |
| 2018/0269133 A1 | 9/2018 | Kume et al. |
| 2020/0381301 A1 | 12/2020 | Hong et al. |
| 2024/0030062 A1 | 1/2024 | Hausmann et al. |
| 2024/0178103 A1 | 5/2024 | Wu et al. |

FOREIGN PATENT DOCUMENTS

| | | |
|---|---|---|
| TW | 201306218 A | 2/2013 |
| TW | 201515173 A | 4/2015 |

OTHER PUBLICATIONS

Office Action dated Apr. 20, 2023 related to Taiwanese Application No. 111124077.

Ex Parte Quayle and and the search report mailed on Aug. 6, 2024 related to U.S. Appl. No. 17/730,342, wherein this application is a DIV of U.S. Appl. No. 17/730,342.

SEMICONDUCTOR DEVICE STRUCTURE WITH COMPOSITE BOTTLE-SHAPED THROUGH SILICON VIA

CROSS-REFERENCE TO RELATED APPLICATION

This application is a divisional application of U.S. Non-Provisional application Ser. No. 17/730,342 filed 27 Apr. 2022, which is incorporated herein by reference in its entirety.

TECHNICAL FIELD

The present disclosure relates to a semiconductor device structure and a method for preparing the same, and more particularly, to a semiconductor device structure with a composite bottle-shaped through-silicon via and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the structure and the manufacturing process of semiconductor devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a silicon layer disposed over a first semiconductor die, and a first mask layer disposed over the silicon layer. The semiconductor device structure also includes a second semiconductor die disposed over the first mask layer, and a through silicon via penetrating through the silicon layer and the first mask layer. A bottom surface of the through silicon via is greater than a top surface of the through silicon via, and the top surface of the through silicon via is greater than a cross-section of the through silicon via between and parallel to the top surface and the bottom surface of the through silicon via.

In an embodiment, the through silicon via is in direct contact with a first conductive pad in the first semiconductor die and a second conductive pad in the second semiconductor die. In an embodiment, the semiconductor device structure further includes a third conductive pad disposed in the first semiconductor die and adjacent to the first conductive pad, and a fourth conductive pad disposed in the second semiconductor die and adjacent to the second conductive pad, wherein a lateral distance between the third conductive pad and the first conductive pad in the first semiconductor die is greater than a lateral distance between the fourth conductive pad and the second conductive pad in the second semiconductor die. In an embodiment, the semiconductor device structure further includes a second mask layer disposed between the first mask layer and the second semiconductor die, wherein the through silicon via penetrates through the second mask layer, and wherein the first mask layer and the second mask layer are made of different materials.

In an embodiment, a sidewall of the second mask layer is inclined relative to a sidewall of the first mask layer. In an embodiment, the semiconductor device structure further includes a protective layer covering the sidewall of the second mask layer, the sidewall of the first mask layer and an upper sidewall of the silicon layer, wherein the upper sidewall of the silicon layer is substantially aligned with the sidewall of the first mask layer. In an embodiment, the through silicon via further includes a conductive layer, a barrier layer covering sidewalls and a bottom surface of the conductive layer, wherein the barrier layer is in direct contact with the first semiconductor die. In addition, the through silicon via includes a lining layer covering sidewalls of the barrier layer.

In another embodiment of the present disclosure, a semiconductor device structure is provided. The semiconductor device structure includes a silicon layer disposed over a first semiconductor die, and a first mask layer disposed over the silicon layer. The semiconductor device structure also includes a second mask layer disposed over the first mask layer, and a second semiconductor die disposed over the second mask layer. The semiconductor device structure further includes a through silicon via penetrating through the silicon layer, the first mask layer and the second mask layer to electrically connect the first semiconductor die and the second semiconductor die. The through silicon via has a bottle-neck shaped portion surrounded by the first mask layer and an upper portion of the silicon layer, and an interface area between the through silicon via and the first semiconductor die is greater than an interface area between the through silicon via and the second semiconductor die.

In an embodiment, the first semiconductor die has a first critical dimension, and the second semiconductor die has a second critical dimension, and the first critical dimension is greater than the second critical dimension. In an embodiment, the through silicon via further includes a top portion surrounded by the second mask layer, and a bottom portion surrounded by a lower portion of the silicon layer, wherein the bottle-neck shaped portion of the through silicon via is sandwiched between the top portion and the bottom portion of the through silicon via, and the top portion of the through silicon via has a tapered profile tapering toward the bottle-neck shaped portion of the through silicon via.

In an embodiment, the bottom portion of the through silicon via has rounded and convex top corners. In an embodiment, the bottle-neck shaped portion and the top portion of the through silicon via are separated from the first mask layer, the second mask layer and the upper portion of the silicon layer by a protective layer. In an embodiment, the bottom portion of the through silicon via is in direct contact with the lower portion of the silicon layer. In an embodiment, the protective layer includes aluminum oxide.

In yet another embodiment of the present disclosure, a method for preparing a semiconductor device structure is provided. The method includes forming a silicon layer over a first semiconductor die, and forming a first mask layer over the silicon layer. The method also includes forming a first opening penetrating through the first mask layer and forming a second opening penetrating through the silicon layer, and depositing a protective layer over the first mask layer. The protective layer extends to cover a sidewall of the first mask layer and an upper sidewall of the silicon layer. The method further includes etching the silicon layer by using the protective layer as a mask to undercut an upper portion of the silicon layer such that an enlarged second opening is formed. In addition, the method includes filling the first opening and the enlarged second opening with a through silicon via, and forming a second semiconductor die over the through silicon via.

In an embodiment, the method further includes forming a second mask layer over the first mask layer, and forming a third opening penetrating through the second mask layer before the first opening penetrating through the first mask layer is formed. In an embodiment, the second mask layer is etched to form an enlarged third opening during the forming the second opening penetrating through the silicon layer, and the enlarged third opening has a tapered profile tapering toward the first opening.

In an embodiment, the protective layer is formed by a non-conformal deposition process. In an embodiment, the method further includes removing the protective layer before the through silicon via is formed. In an embodiment, the upper portion of the silicon layer covers a bottom portion of the through silicon via.

Embodiments of a semiconductor device structure and method for preparing the same are provided in the disclosure. In some embodiments, the semiconductor device structure includes a through silicon via. The bottom surface of the through silicon via is greater than the top surface of the through silicon via, and the top surface of the through silicon via is greater than a cross-section of the through silicon via between and parallel to the top surface and the bottom surface of the through silicon via. Therefore, the through silicon via can be used to electrically connect two semiconductor dies (or semiconductor wafers) with different design rules (e.g., different pattern densities or different critical dimensions) in the vertical direction. As a result, functional density (i.e., the number of interconnected devices per chip area) may be increased, providing benefits such as increased production efficiency, lowered costs, and improved performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
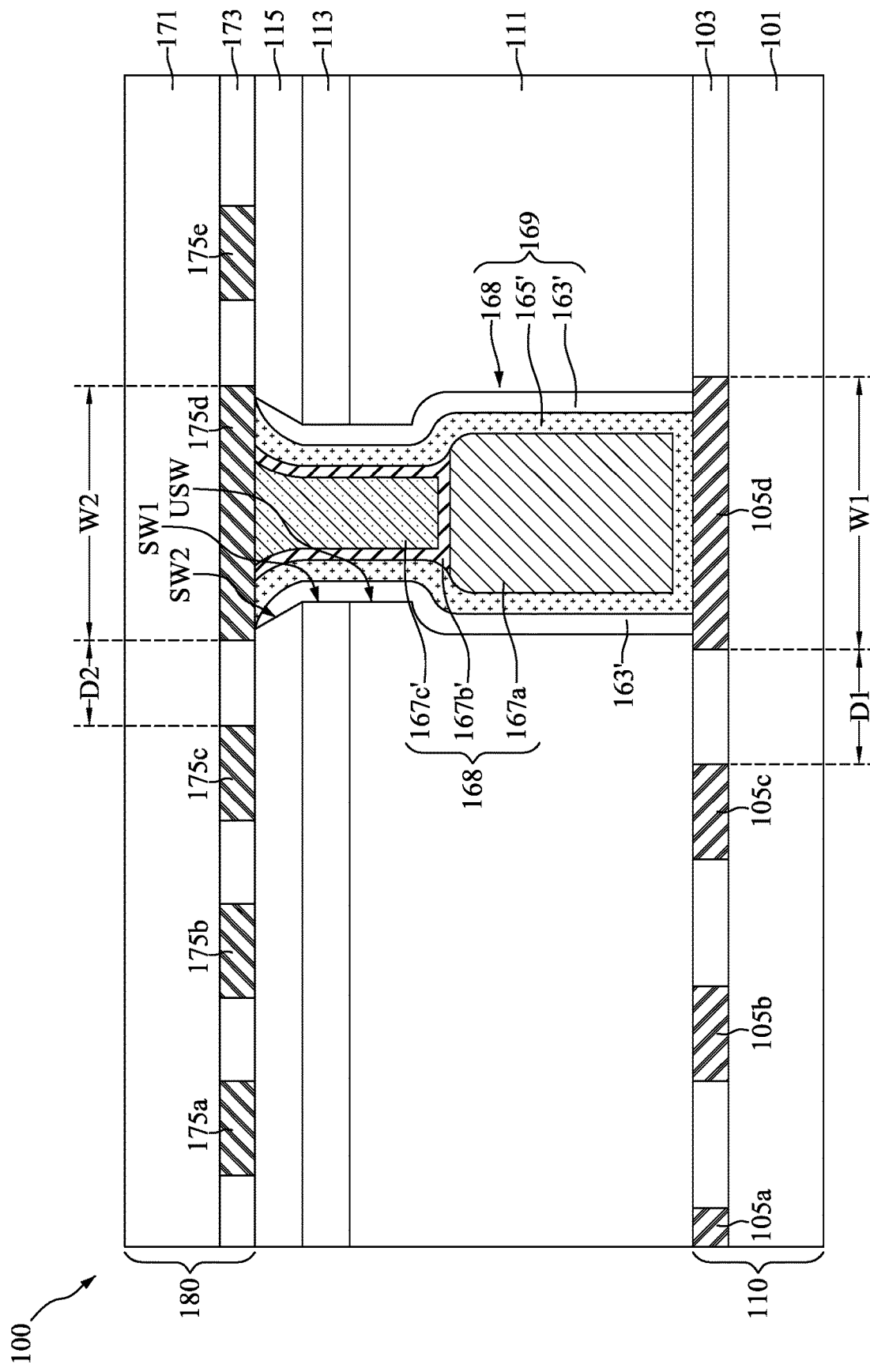
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes a first semiconductor die 110, a silicon layer 111 disposed over the first semiconductor die 110, a first mask layer 113 disposed over the silicon layer 111, a second mask layer 115 disposed over the first mask layer 113, and a second semiconductor die 180 disposed over the second mask layer 115.

In some embodiments, the first semiconductor die 110 includes a semiconductor substrate 101, a dielectric layer 103 disposed over the semiconductor substrate 101, and a plurality of conductive pads 105a, 105b and 105c disposed in the dielectric layer 103. In some embodiments, the conductive pads 105a, 105b and 105c are arranged to face the silicon layer 111. Similar to the first semiconductor die 110, the second semiconductor die 180 includes a semiconductor substrate 171, a dielectric layer 173, and a plurality of conductive pads 175a, 175b, 175c, 175d and 175e disposed in the dielectric layer 173. In some embodiments, the conductive pads 175a, 175b, 175c, 175d and 175e are arranged to face the second mask layer 115.

Still referring to FIG. 1, the semiconductor device structure 100 also includes a composite through silicon via 169 penetrating through the silicon layer 111, the first mask layer 113 and the second mask layer 115, in accordance with some embodiments. In some embodiments, the composite through silicon via 169 electrically connects the conductive pad 105d in the first semiconductor die 110 and the conductive pad 175d in the second semiconductor die 180. In some embodiments, the composite through silicon via 169 is disposed in a keep-out zone, which is used to define a region where no active device is placed within.

In some embodiments, the composite through silicon via 169 includes a composite conductor 168, a barrier layer 165' surrounding the composite conductor 168, and a lining layer 163' surrounding the barrier layer 165'. In some embodiments, the barrier layer 165' covers the bottom surface and the sidewalls of the composite conductor 168, and the lining layer 163' covers the sidewalls of the barrier layer 165'. In some embodiments, the barrier layer 165' and the lining layer 163' are in direct contact with the conductive pad 105d, and the composite conductor 168 is separated from the conductive pad 105c by the barrier layer 165'. In some embodiments, the composite conductor 168 has a bottle-shaped profile, including a lower conductor 167a, a graphene layer 167b' disposed on the lower conductor 167a and an upper conductor 167c' in the graphene layer 167b'.

Moreover, the composite through silicon via 169 has a bottle-shaped profile, as shown in FIG. 1 in accordance with some embodiments. In addition, the sidewalls SW2 of the second mask layer 115 are inclined relative to the sidewalls SW1 of the first mask layer 113, and the sidewalls SW1 of the first mask layer 113 are substantially aligned with the upper sidewalls USW of the silicon layer 111, in accordance with some embodiments. Within the context of this disclosure, the word "substantially" means preferably at least 90%, more preferably 95%, even more preferably 98%, and most preferably 99%.

Furthermore, the critical dimension of the first semiconductor die 110 is greater than the critical dimension of the second semiconductor die 180, in accordance with some embodiments. In some embodiments, the pattern density of the second semiconductor die 180 is greater than the pattern density of the first semiconductor die 110. In some embodiments, the conductive pad 105d directly contacting the composite through silicon via 169 has a width W1, the conductive pad 175d directly contacting the composite through silicon via 169 has a width W2, and the width W1 is greater than the width W2. In some embodiments, a lateral distance (space) between two adjacent conductive pads 105 in the first semiconductor die 110 is greater than a lateral distance between two adjacent conductive pads 175 in the second semiconductor die 180. For example, the lateral distance D1 between the two adjacent conductive pads 105c and 105d is greater than the lateral distance D2 between the two adjacent conductive pads 175c and 175d. Since the composite through silicon via 169 has a bottle-shaped profile, the composite through silicon via 169 can be used to electrically connect the first semiconductor die 110 and the second semiconductor die 180 with different design rules (e.g., different pattern densities or different critical dimensions/spaces). For example, the conductive pad 105d with greater width W1 contacts the wider bottom portion of the composite through silicon via 169, while the conductive pad 175d with smaller width W2 contacts the narrower upper portion of the composite through silicon via 169.

Figure 2:
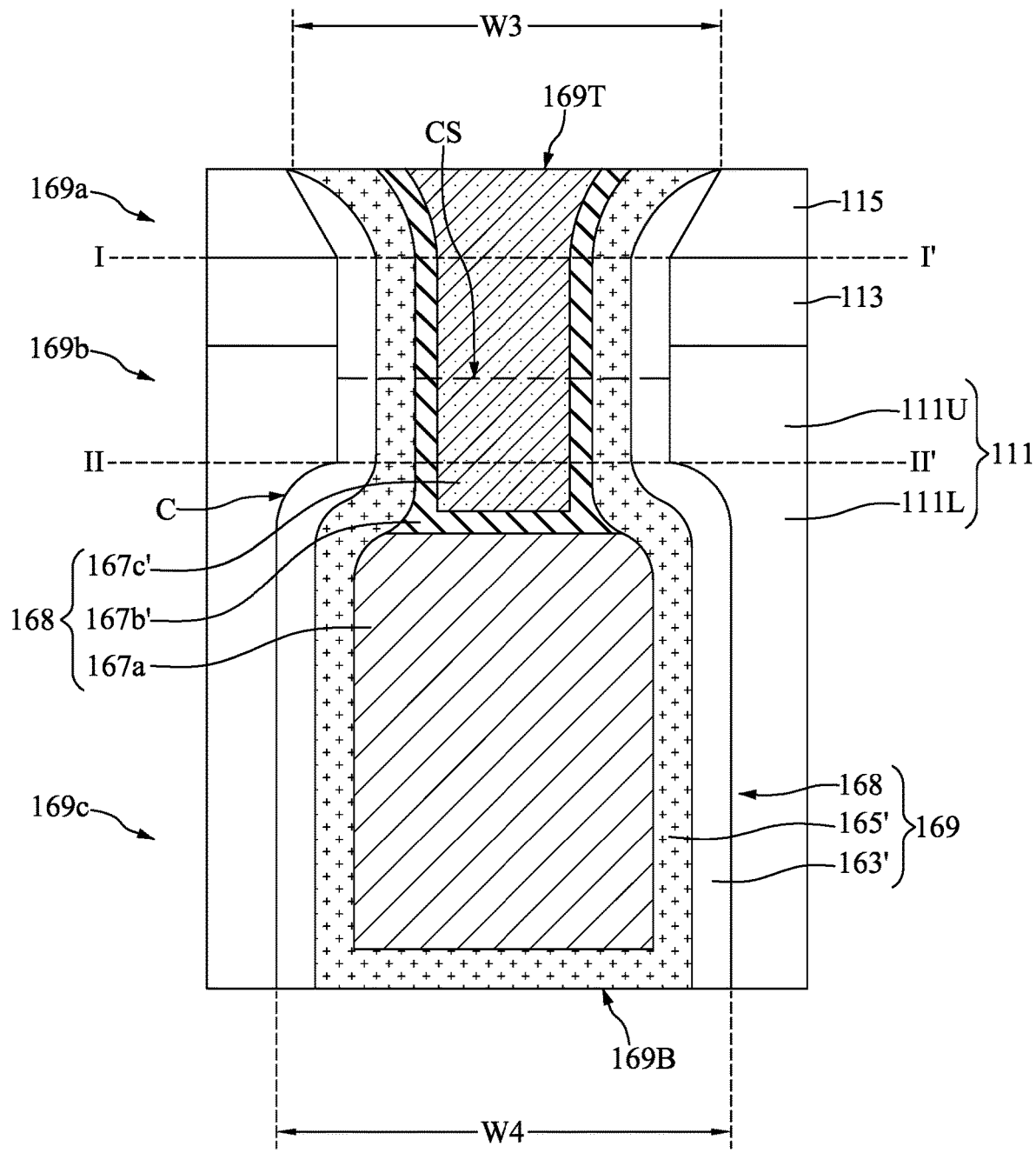
FIG. 2 is a partial enlarged view of FIG. 1, in accordance with some embodiments.

FIG. 2 is a partial enlarged view of FIG. 1, in accordance with some embodiments. FIG. 2 illustrates the composite through silicon via 169 and its surroundings. In some embodiments, the composite through silicon via 169 includes a top portion 169a, a bottom portion 169c, and a bottle-neck shaped portion 169b sandwiched between the top portion 169a and the bottom portion 169c. The boundary of the top portion 169a and the bottle-neck shaped portion 169b is indicated by the dotted line I-I', and the boundary of the bottle-neck shaped portion 169b and the bottom portion 169c is indicated by the dotted line II-IT. In some embodiments, the composite through silicon via 169 has a bottom width W3 (i.e., the bottommost width of the bottom portion 169c) and a top width W4 (i.e., the topmost width of the top portion 169a), the bottom width W3 is greater than the top width W4. Referring to FIGS. 1 and 2, the bottom portion 169c of the composite through silicon via 169 contacts the conductive pad 105d having the greater width W1, and the top portion 169a of the composite through silicon via 169 contacts the conductive pad 175d having the smaller width W2. Therefore, the composite through silicon via 169 can be used to electrically connect the first semiconductor die 110 and the second semiconductor die 180, which have different design rules, e.g., pad width/space width.

In some embodiments, the top portion 169a of the composite through silicon via 169 is surrounded by the second mask layer 115, and the top portion 169a of the composite through silicon via 169 has a tapered profile tapering toward the bottle-neck shaped portion 169b of the composite through silicon via 169. In other words, the width of the top portion 169a of the composite through silicon via 169 gradually increase along a direction from bottom to top. In some embodiments, the bottle-neck shaped portion 169b of the composite through silicon via 169 is surrounded by the first mask layer 113 and an upper portion 111U of the silicon layer 111, and the width of the bottle-neck shaped portion 169b of the composite through silicon via 169 is substantially the same.

Moreover, the bottom portion 169c of the composite through silicon via 169 is surrounded by a lower portion 111L of the silicon layer 111. In some embodiments, the bottom portion 169c of the composite through silicon via 169 has rounded and convex top corners C. In some embodiments, the bottom portion 169c of the composite through silicon via 169 is partially covered by the silicon layer 111. In addition, the composite through silicon via 169 has a top surface 169T (i.e., the interface between the composite through silicon via 169 and the conductive pad 175d in the second semiconductor die 180) and a bottom surface 169B (i.e., the interface between the composite through silicon via 169 and the conductive pad 105d in the first semiconductor die 110). In some embodiments, the bottom surface 169B is greater than the top surface 169T, and the top surface 169T is greater than a cross-section of the composite through silicon via 169 between and parallel to the top surface 169T and the bottom surface 169B, such as the cross-section CS of the bottle-neck shaped portion 169b. That is, the bottom width W3 of the composite through silicon via 169 is greater than the top width W4 of the composite through silicon via 169, in accordance with some embodiments.

Figure 3:
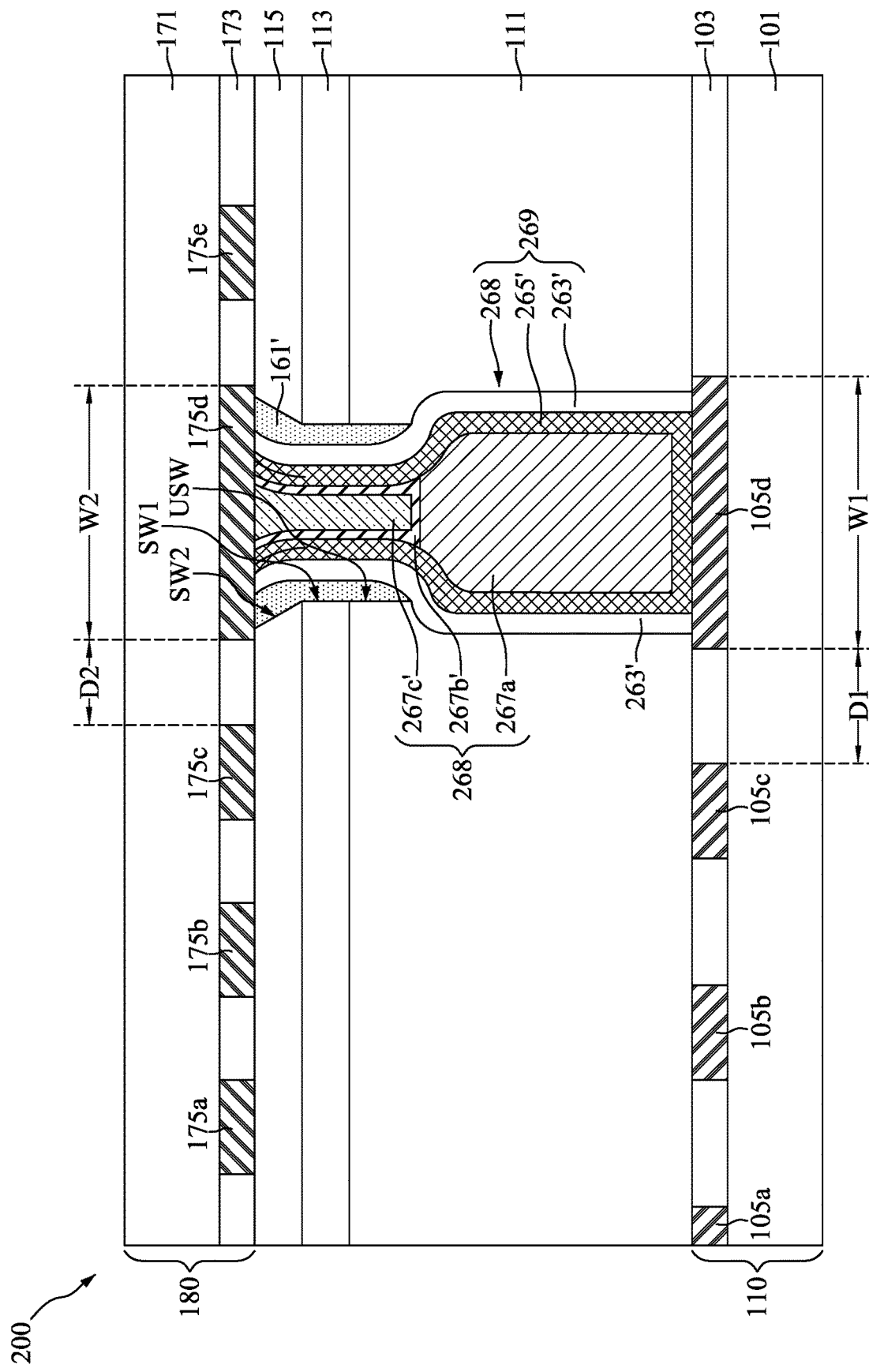
FIG. 3 is a cross-sectional view illustrating a modified semiconductor device structure, in accordance with some embodiments.

FIG. 3 is a cross-sectional view illustrating a modified semiconductor device structure 200, which is an alternative embodiment of the semiconductor device structure 100, in accordance with some embodiments. For reasons of consistency and clarity, similar components appearing in both FIGS. 1 and 3 will be labeled the same.

Similar the semiconductor device structure 100 in FIG. 1, the semiconductor device structure 200 includes a composite through silicon via 269 disposed in a keep-out zone. The composite through silicon via 269 includes a composite conductor 268, a barrier layer 265' surrounding the composite conductor 268, and a lining layer 263' surrounding the barrier layer 265'. In some embodiments, the composite conductor 268 has a bottle-shaped profile, including a lower conductor 267a, a graphene layer 267b' disposed on the lower conductor 267a and an upper conductor 267c' in the graphene layer 167b'. A difference between the semiconductor device structure 100 in FIG. 1 and the semiconductor device structure 200 in FIG. 3 is that the semiconductor device structure 200 further includes a protective layer 161'. As shown in FIG. 3, the sidewalls SW2 of the second mask layer 115, the sidewalls SW1 of the first mask layer 113 and the upper sidewalls USW of the silicon layer 111 are covered by the protective layer 161', in accordance with some embodiments.

Figure 4:
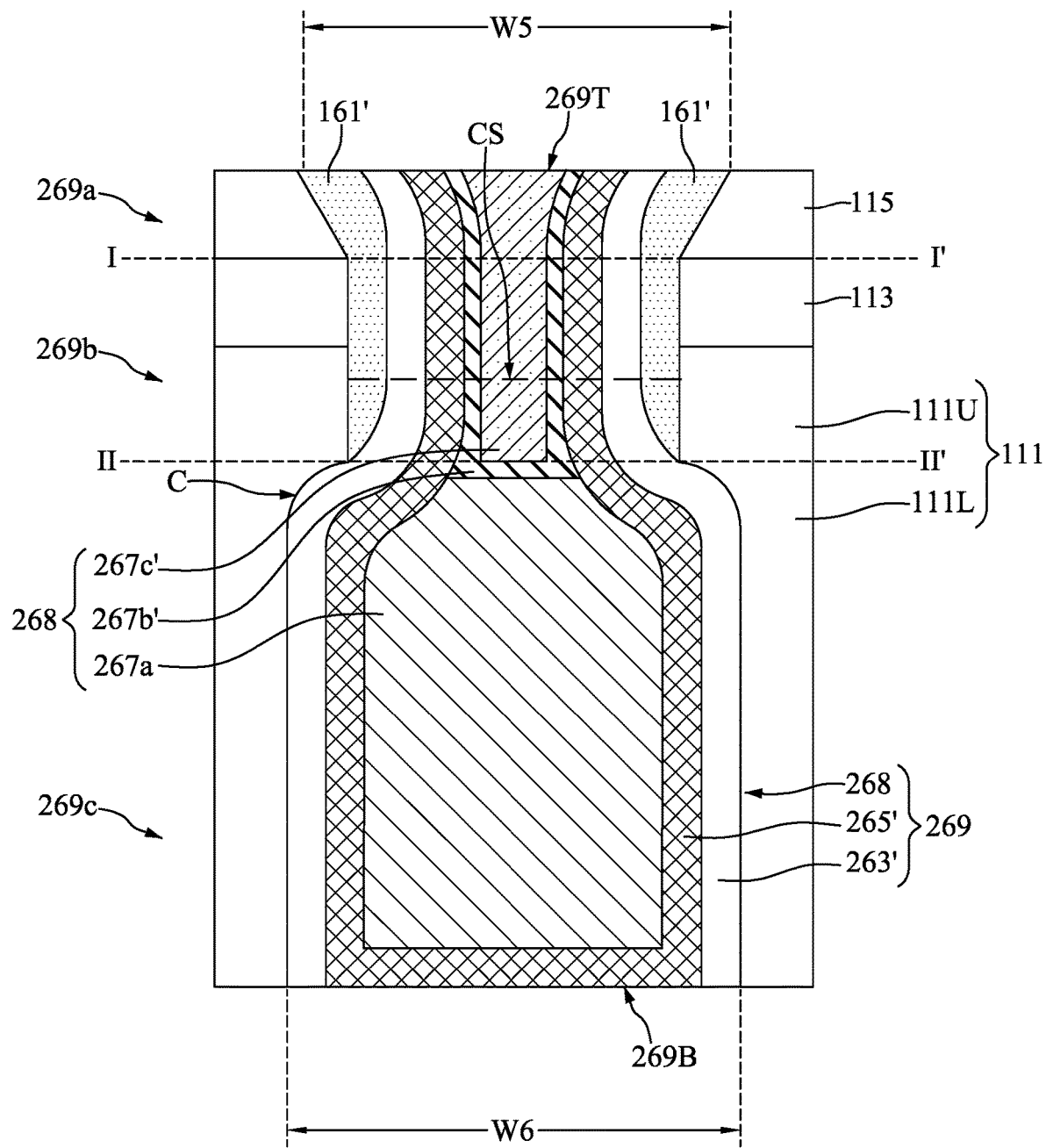
FIG. 4 is a partial enlarged view of FIG. 3, in accordance with some embodiments.

FIG. 4 is a partial enlarged view of FIG. 3, in accordance with some embodiments. FIG. 4 illustrates the composite through silicon via 269, the protective layer 161' and their surroundings. In some embodiments, the composite through silicon via 269 includes a top portion 269a, a bottom portion 269c, and a bottle-neck shaped portion 269b sandwiched between the top portion 269a and the bottom portion 269c. The boundary of the top portion 269a and the bottle-neck shaped portion 269b is indicated by the dotted line I-I', and the boundary of the bottle-neck shaped portion 269b and the bottom portion 269c is indicated by the dotted line II-II'.

In some embodiments, the top portion 269a of the composite through silicon via 269 is surrounded by the second mask layer 115, and the top portion 269a of the composite through silicon via 269 has a tapered profile tapering toward the bottle-neck shaped portion 269b of the composite through silicon via 269. Similarly, the protective layer 161' has a tapered profile tapering toward the bottle-neck shaped portion 269b of the composite through silicon via 269. In other words, the widths of the top portion 269a of the composite through silicon via 269 gradually increase along a direction from bottom to top. In some embodiments, the bottle-neck shaped portion 269b of the composite through silicon via 269 is surrounded by the first mask layer 113 and an upper portion 111U of the silicon layer 111, and the widths of the bottle-neck shaped portion 269b of the composite through silicon via 269 are substantially the same.

Moreover, the bottom portion 269c of the composite through silicon via 269 is surrounded by a lower portion 111L of the silicon layer 111. In some embodiments, the bottom portion 269c of the composite through silicon via 269 has rounded and convex top corners C. In some embodiments, the bottom portion 269c of the composite through silicon via 269 is partially covered by the silicon layer 111. In addition, the composite through silicon via 269 has a top surface 269T (i.e., the interface between the composite through silicon via 269 and the conductive pad 175d in the second semiconductor die 180) and a bottom surface 269B (i.e., the interface between the composite through silicon via 269 and the conductive pad 105d in the first semiconductor die 110). In some embodiments, the bottom surface 269B is greater than the top surface 269T, and the top surface 269T is greater than a cross-section of the composite through silicon via 269 between and parallel to the top surface 269T and the bottom surface 269B, such as the cross-section CS of the bottle-neck shaped portion 269b.

In some embodiments, the composite through silicon via 269 has a bottom width W5 (i.e., the bottommost width of the bottom portion 269c) and a top width W6 (i.e., the topmost width of the top portion 269a), and the bottom width W5 is greater than the top width W6. Referring to FIGS. 3 and 4, the bottom portion 269c of the composite through silicon via 269 contacts the conductive pad 105d having the greater width W1, and the top portion 269a of the composite through silicon via 269 contacts the conductive pad 175d having the smaller width W2. Therefore, the composite through silicon via 269 can be used to electrically connect the first semiconductor die 110 and the second semiconductor die 180, which have different design rules.

It should be noted that the first mask layer 113, the second mask layer 115 and the upper portion 111U of the silicon layer 111 are separated from the composite through silicon via 269 by the protective layer 161', in accordance with some embodiments. In some embodiments, the top portion 269a and the bottle-neck shaped portion 269b of the composite through silicon via 269 are surrounded by the protective layer 161'. In some embodiments, the bottom portion 269c of the composite through silicon via 269 is in direct contact with the lower portion 111L of the silicon layer 111.

Figure 5:
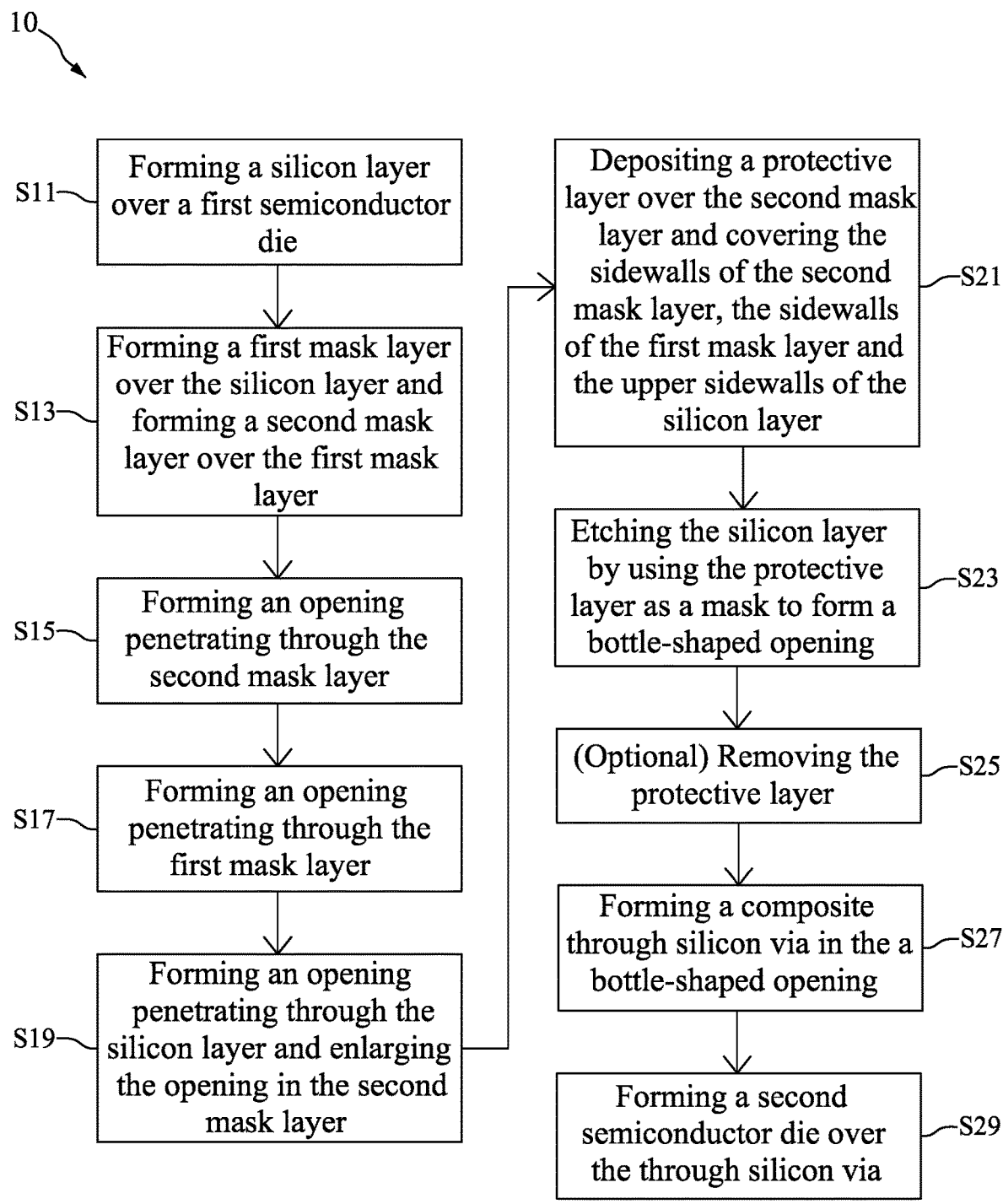
FIG. 5 is a flow diagram illustrating a method for preparing a semiconductor device structure, in accordance with some embodiments.

FIG. 5 is a flow diagram illustrating a method 10 for forming a semiconductor device structure (including the semiconductor device structure 100 and the modified semiconductor device structure 200), and the method 10 includes steps S11, S13, S15, S17, S19, S21, S23, S25, S27 and S29, in accordance with some embodiments. The steps S11 to S29 of FIG. 5 are elaborated in connection with the following figures.

Figure 6:
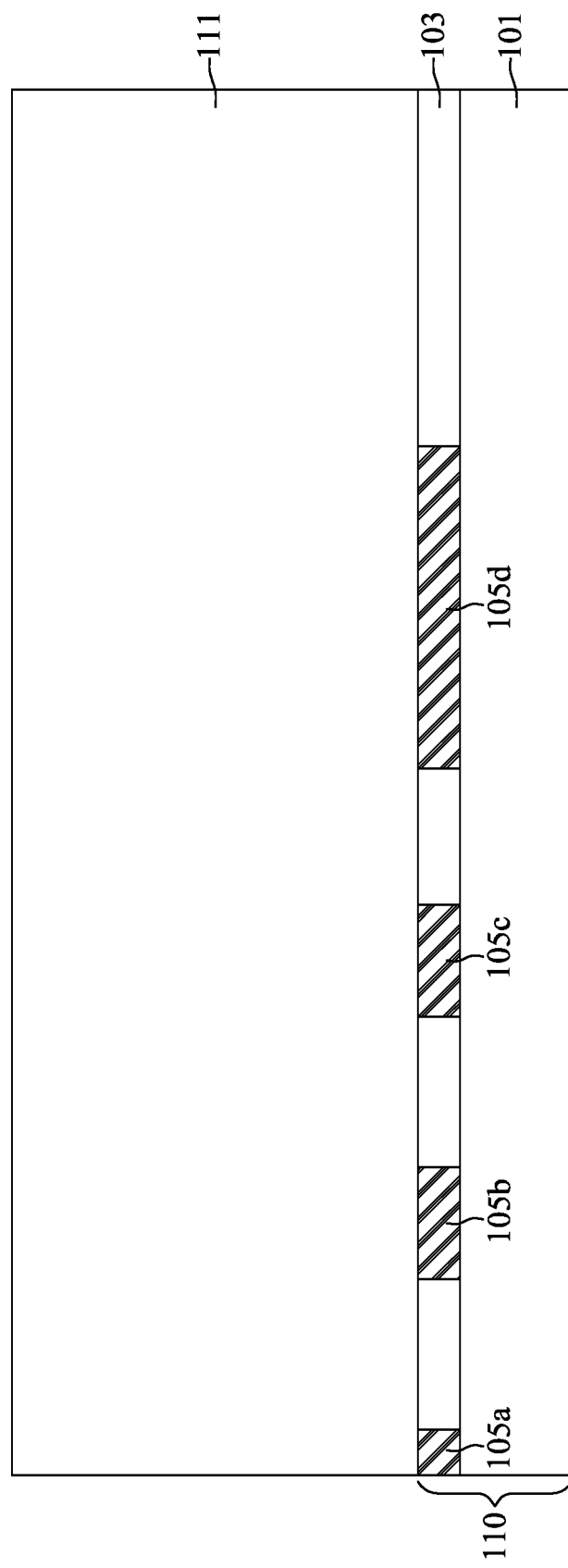
FIG. 6 is a cross-sectional view illustrating an intermediate stage of forming a silicon layer over a first semiconductor die during the formation of the semiconductor device structure, in accordance with some embodiments.

FIGS. 6 to 18 are cross-sectional views illustrating intermediate stages of forming the semiconductor device structure 100, in accordance with some embodiments. As shown in FIG. 6, the first semiconductor die 110 including the semiconductor substrate 101, the dielectric layer 103 and the conductive pads 105a, 105b and 105c is provided, and the silicon layer 111 is formed over the first semiconductor die 110, in accordance with some embodiments. The respective step is illustrated as the step S11 in the method 10 shown in FIG. 5.

The first semiconductor die 110 may be a portion of an integrated circuit (IC) chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LD-MOS) transistors, high voltage transistors, high frequency transistors, fin field-effect transistors (FinFETs), other suitable IC components, or combinations thereof.

Depending on the IC fabrication stage, the first semiconductor die 110 may include various material layers (e.g., dielectric layers, semiconductor layers, and/or conductive layers) configured to form IC features (e.g., doped regions, isolation features, gate features, source/drain features, interconnect features, other features, or combinations thereof). The first semiconductor die 110 has been simplified for the sake of clarity. It should be noted that additional features can be added in the first semiconductor die 110, and some of the features described below can be replaced, modified, or eliminated in other embodiments. In some embodiments, the silicon layer 111 is epitaxially grown on the first semiconductor die 110.

Figure 7:
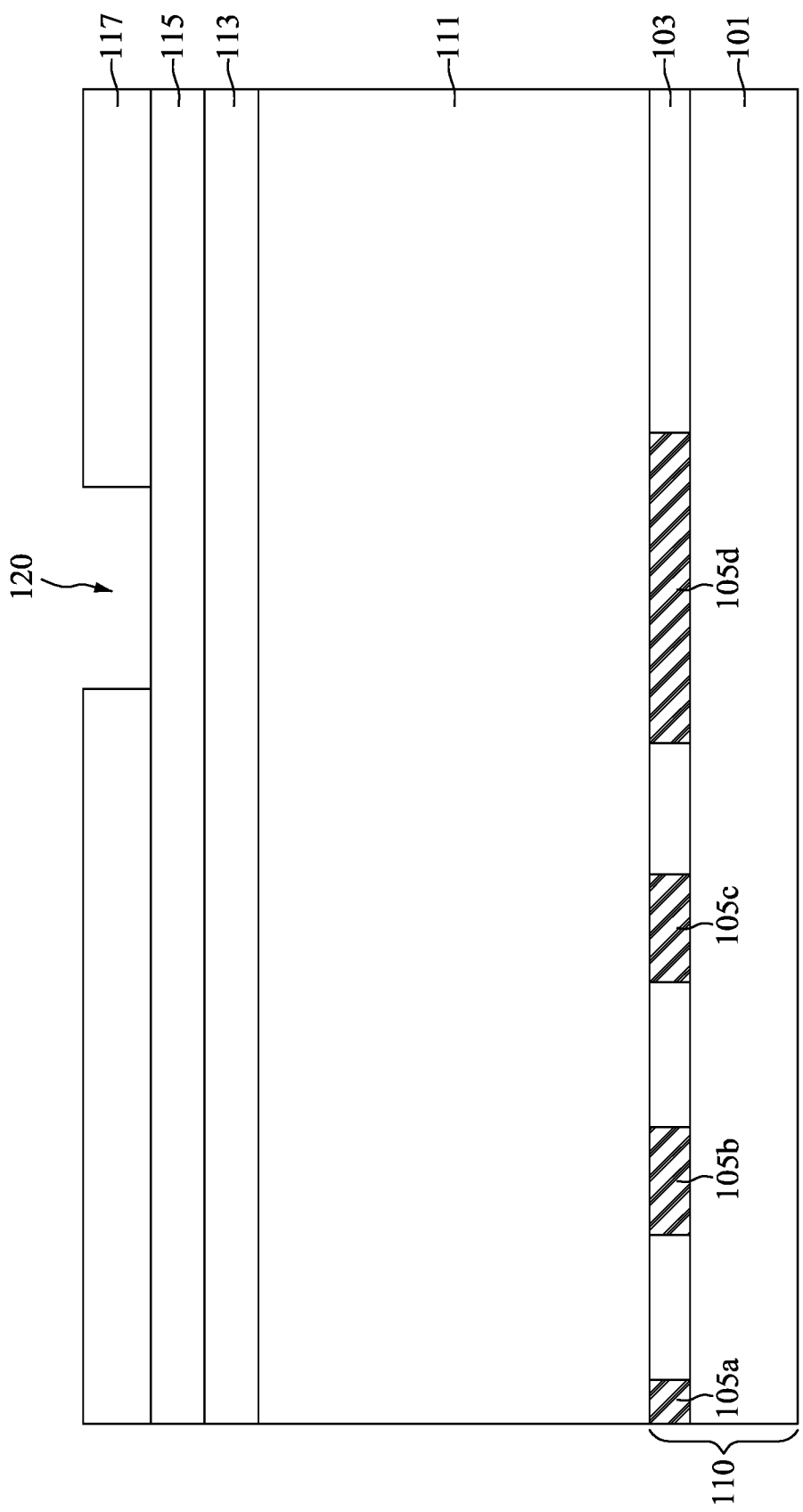
FIG. 7 is a cross-sectional view illustrating an intermediate stage of sequentially forming a first mask layer and a second mask layer over the silicon layer during the formation of the semiconductor device structure, in accordance with some embodiments.

Next, the first mask layer 113 is formed over the silicon layer 111, and the second mask layer 115 is formed over the first mask layer 113, as shown in FIG. 7 in accordance with some embodiments. The respective step is illustrated as the step S13 in the method 10 shown in FIG. 5. In some embodiments, the first mask layer 113 and the second mask layer 115 are made of dielectric materials, such as silicon oxide, silicon nitride, silicon oxynitride, and are formed by deposition processes, such as chemical vapor deposition (CVD) processes, physical vapor deposition (PVD) processes, spin-on coating processes. Moreover, a patterned mask 117 is formed over the second mask layer 115, in accordance with some embodiments. In some embodiments, the patterned mask 117 has an opening 120 exposing a portion of the second mask layer 115.

Figure 8:
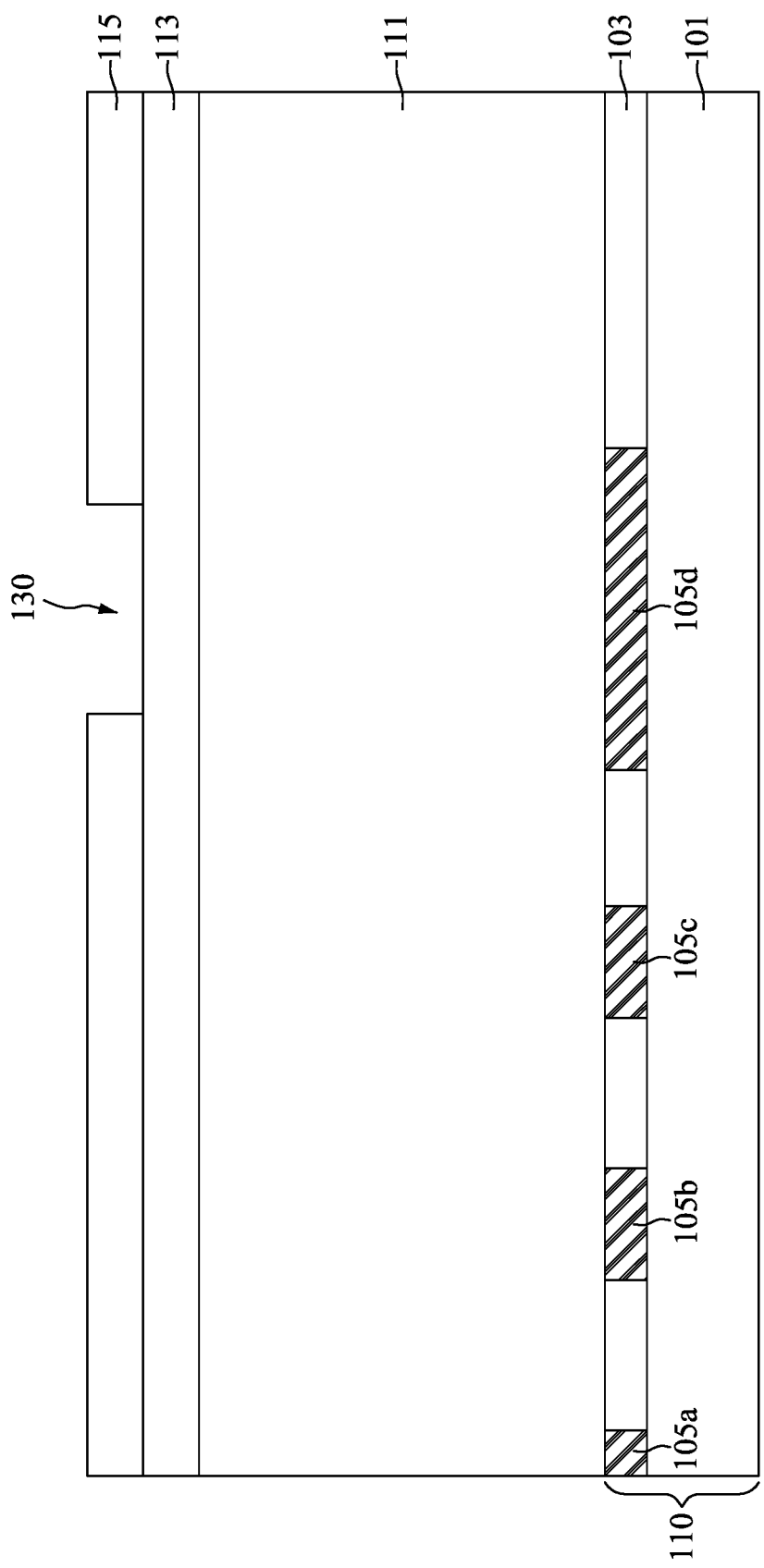
FIG. 8 is a cross-sectional view illustrating an intermediate stage of forming an opening in the second mask layer during the formation of the semiconductor device structure, in accordance with some embodiments.

Subsequently, the second mask layer 115 is etched by using the patterned mask 117 as a mask, such that an opening 130 is formed penetrating through the second mask layer 115, as shown in FIG. 8 in accordance with some embodiments. The respective step is illustrated as the step S15 in the method 10 shown in FIG. 5. In some embodiments, a portion of the first mask layer 113 is exposed by the opening 130 in the second mask layer 115. The etching process may be a dry etching process, a wet etching process, or a combination thereof. After the etching process, the patterned mask 117 may be removed.

Figure 9:
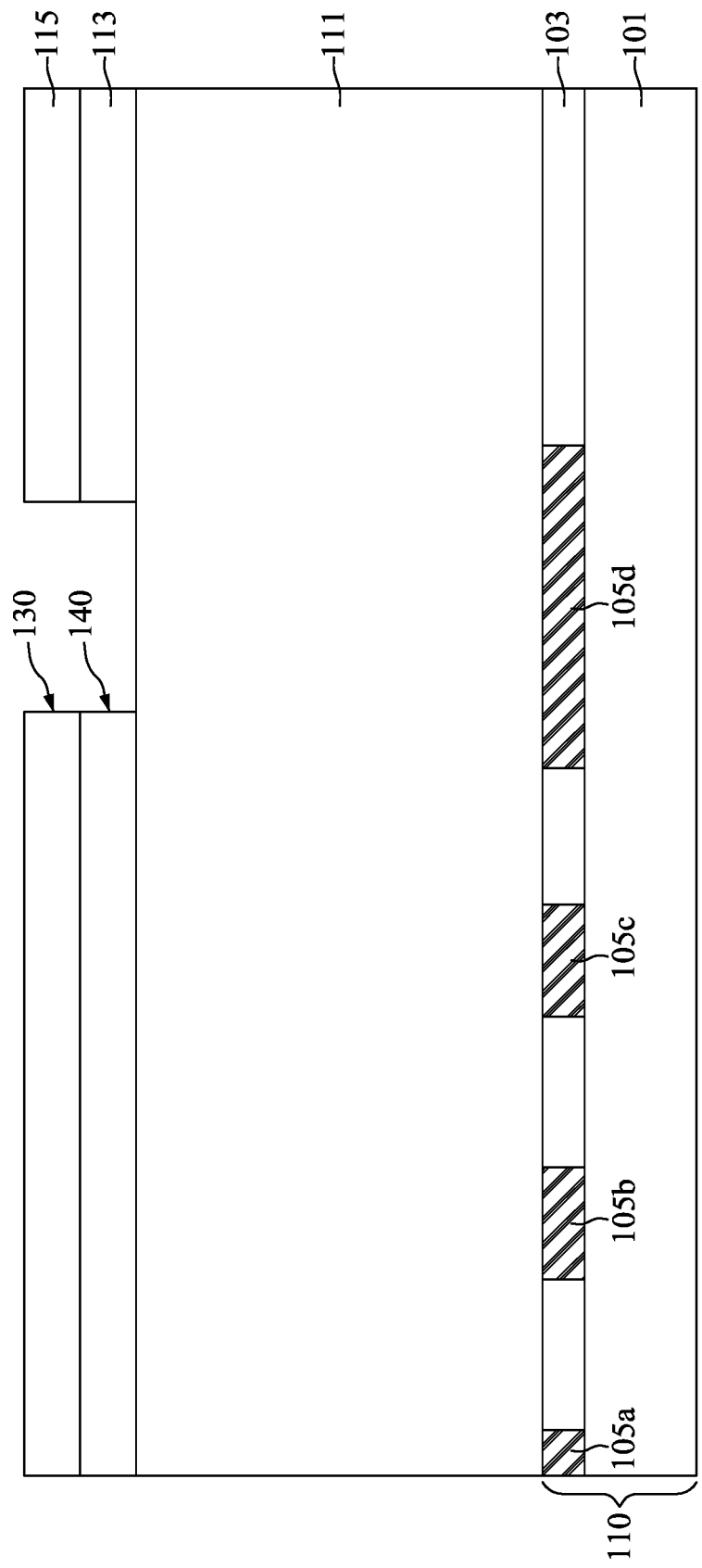
FIG. 9 is a cross-sectional view illustrating an intermediate stage of forming an opening in the first mask layer during the formation of the semiconductor device structure, in accordance with some embodiments.

Then, the first mask layer 113 is etched by using the second mask layer 115 as a mask, such that an opening 140 is formed penetrating through the first mask layer 113, as shown in FIG. 9 in accordance with some embodiments. The respective step is illustrated as the step S17 in the method 10 shown in FIG. 5. In some embodiments, a portion of the silicon layer 111 is exposed by the opening 140 in the first mask layer 113. The etching process may be a dry etching process, a wet etching process, or a combination thereof. In some embodiments, the sidewalls of the opening 140 in the first mask layer 113 is substantially aligned with the sidewalls of the opening 130 in the second mask layer 115.

Figure 10:
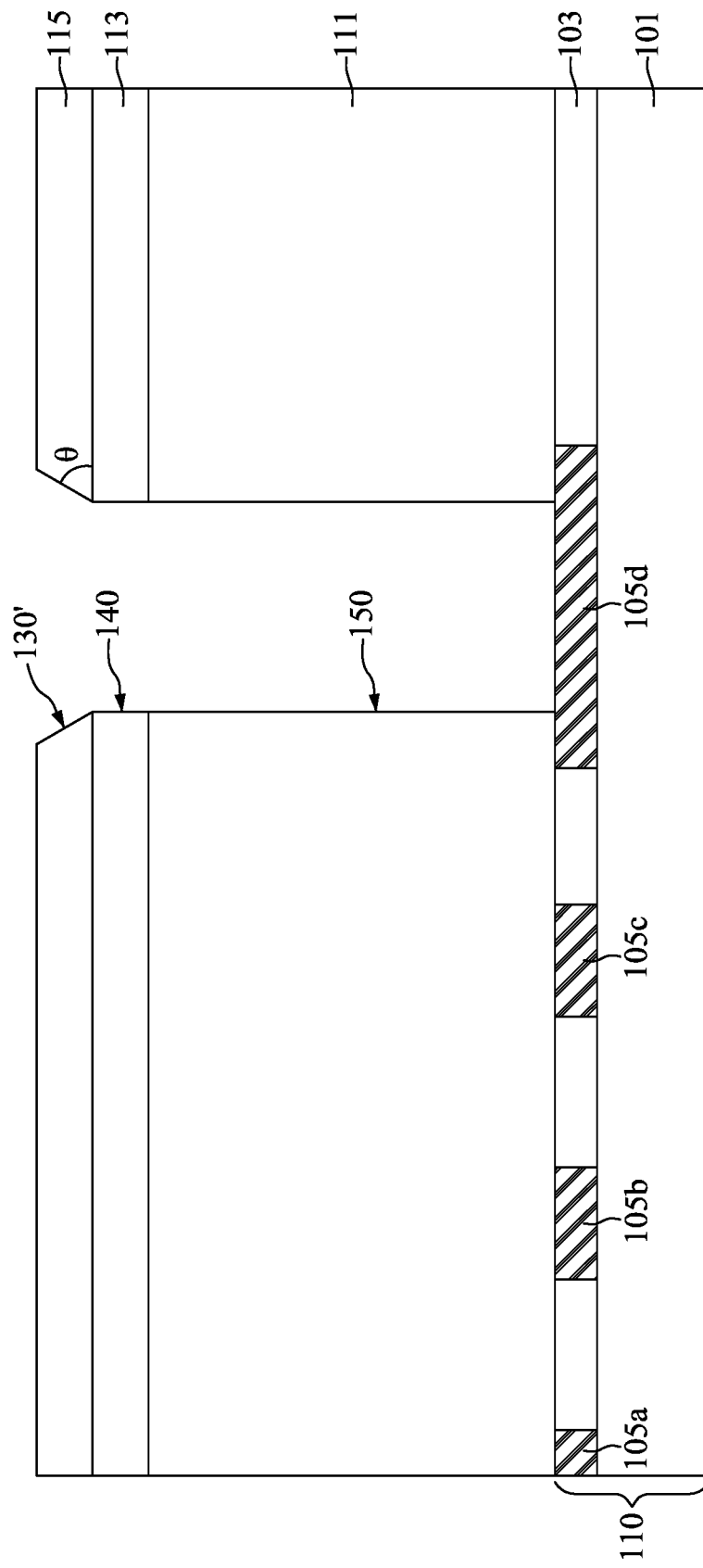
FIG. 10 is a cross-sectional view illustrating an intermediate stage of forming an opening in the silicon layer during the formation of the semiconductor device structure, in accordance with some embodiments.

After the openings 130 and 140 are formed, the silicon layer 111 is etched by using the first mask layer 113 as a mask, such that an opening 150 is formed penetrating through the silicon layer 111, as shown in FIG. 10 in accordance with some embodiments. The respective step is illustrated as the step S19 in the method 10 shown in FIG. 5. The etching process may be a dry etching process, a wet etching process, or a combination thereof.

In some embodiments, the conductive pad 105d is exposed by the opening 150. In some embodiments, the second mask layer 115 is formed from a material that has a high etching selectivity compared to the material of the first mask layer 113. As a result, the second mask layer 115 is etched to form an enlarged opening 130' during the etching process for forming the opening 150 in the silicon layer 111.

In some embodiments, the enlarged opening 130' has a tapered profile tapering toward the opening 140 in the first mask layer 113. In some embodiments, the second mask layer 115 have inclined sidewalls relative to the sidewalls of the first mask layer 113, and an angle θ is between the inclined sidewalls and the bottom surface of the second mask layer 115. In some embodiments, the angle θ is in a range from about 46 degrees to about 60 degrees. The inclined sidewalls of the second mask layer 115 can provide improved step coverage for the subsequently formed protective layer 161.

Figure 11:
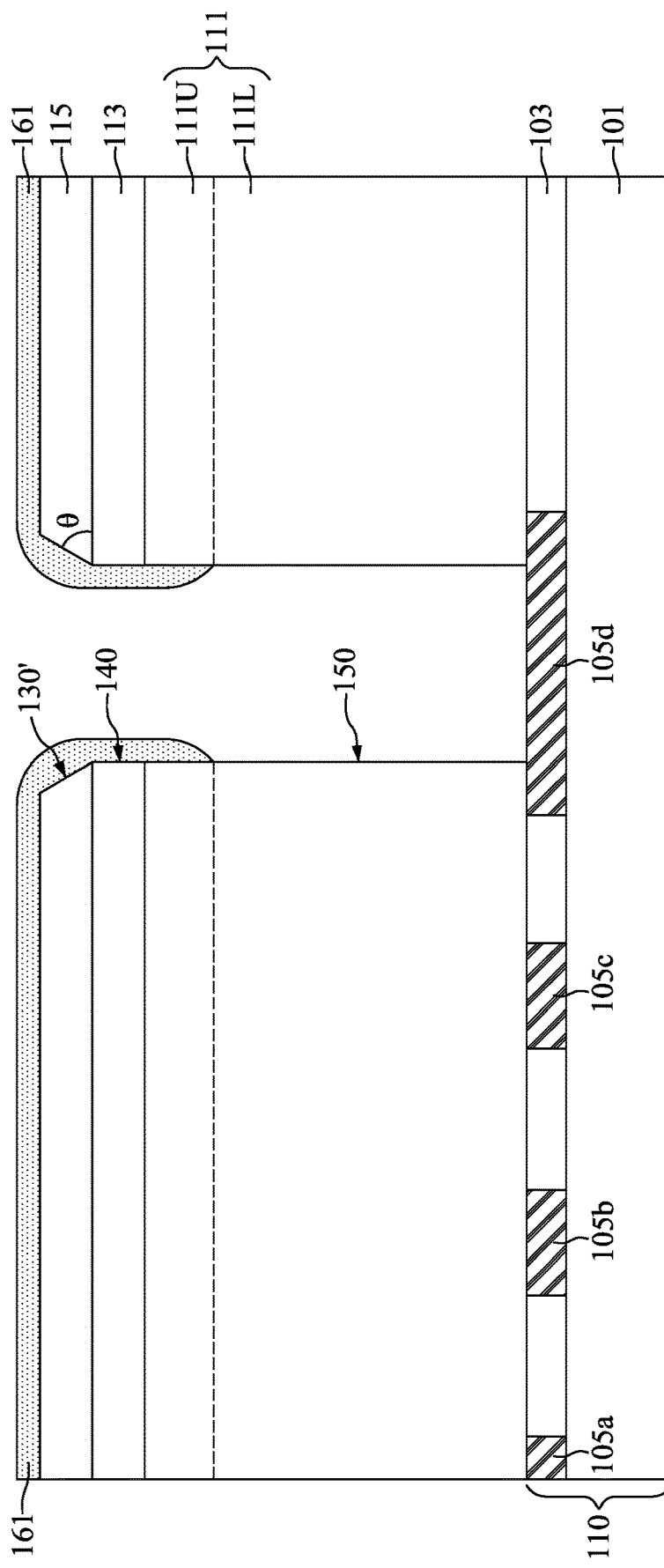
FIG. 11 is a cross-sectional view illustrating an intermediate stage of depositing a protective layer during the formation of the semiconductor device structure, in accordance with some embodiments.

Next, the protective layer 161 is deposited over the second mask layer 115 and covering the sidewalls of the second mask layer 115, the sidewalls of the first mask layer 113 and the upper sidewalls of the silicon layer 111 (i.e., the sidewalls of the upper portion 111U of the silicon layer 111), as shown in FIG. 11 in accordance with some embodiments. The respective step is illustrated as the step S21 in the method 10 shown in FIG. 5. It should be noted that the lower sidewalls of the silicon layer 111 (i.e., the sidewalls of the lower portion 111L of the silicon layer 111) are not covered by the protective layer 161.

The dotted line of FIG. 11 is used to illustrate the boundary of the upper portion 111U and the lower portion 111L of the silicon layer 111. In some embodiments, the protective layer 161 is formed by a non-conformal deposition process, such as a non-conformal liner atomic layer deposition (NOLA) process. In some embodiments, the protective layer 161 includes an oxide material, such as aluminum oxide.

Figure 12:
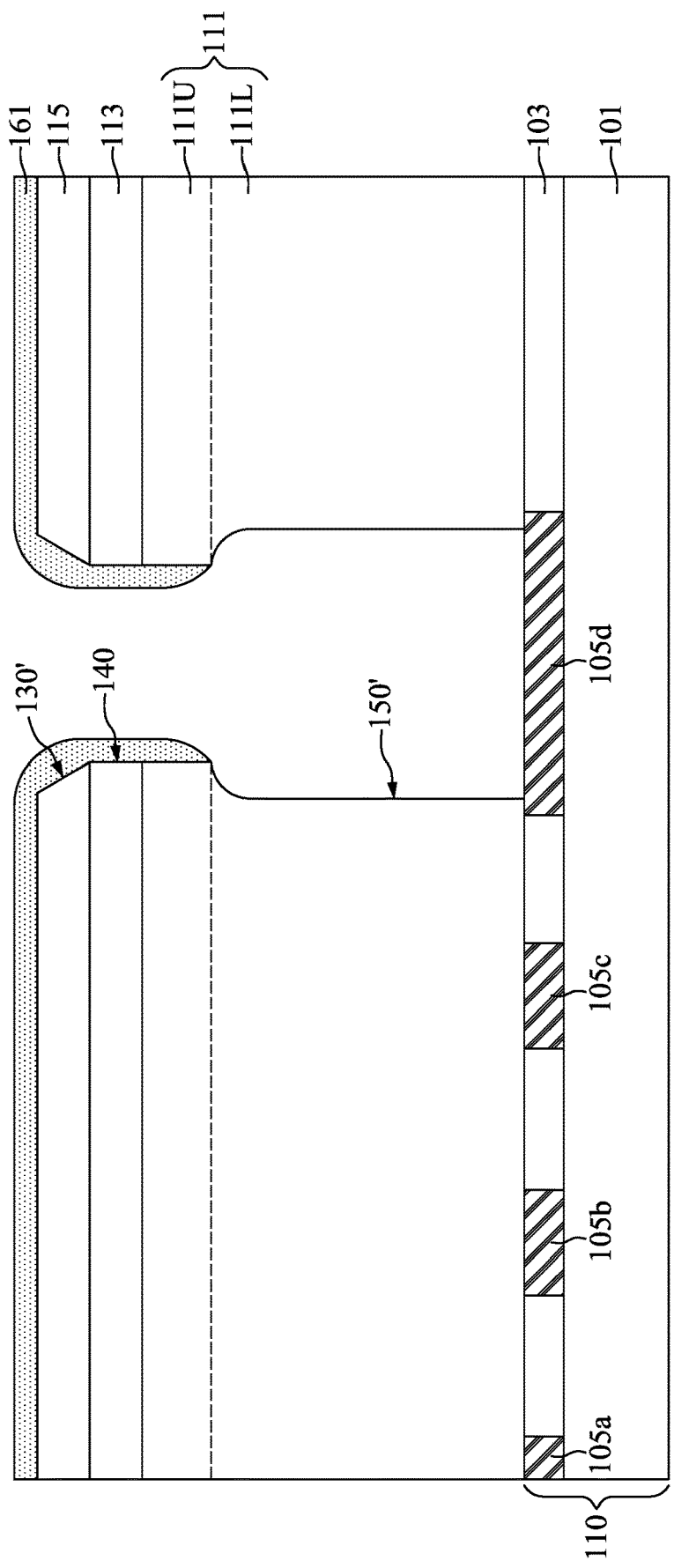
FIG. 12 is a cross-sectional view illustrating an intermediate stage of etching the silicon layer by using the protective layer as a mask during the formation of the semiconductor device structure, in accordance with some embodiments.

Then, the silicon layer 111 is etched by using the protective layer 161 as a mask to form an enlarged opening 150' having a bottle-shaped profile, as shown in FIG. 12 in accordance with some embodiments. The respective step is illustrated as the step S23 in the method 10 shown in FIG. 5. In some embodiments, the lower portion 111L of the silicon layer 111 is laterally etched, while the upper portion 111U of the silicon layer 111 remains intact for being shielded by the protective layer 161.

In some embodiments, the upper portion 111U of the silicon layer 111 is undercut by the etching process for forming the enlarged opening 150'. In some embodiments, the enlarged opening 150' may be formed by an isotropic etching process. The isotropic etching process may be a wet etching process, a dry etching process, or a combination thereof. In some embodiments, an etching solution including nitric acid ($HNO_3$) and hydrofluoric acid (HF) is used to form the enlarged opening 150'. In some embodiments, the etching solution further includes phosphoric acid ($H_3PO_4$). In other embodiments, fluorine-based plasma is used to form the enlarged opening 150'.

Figure 13:
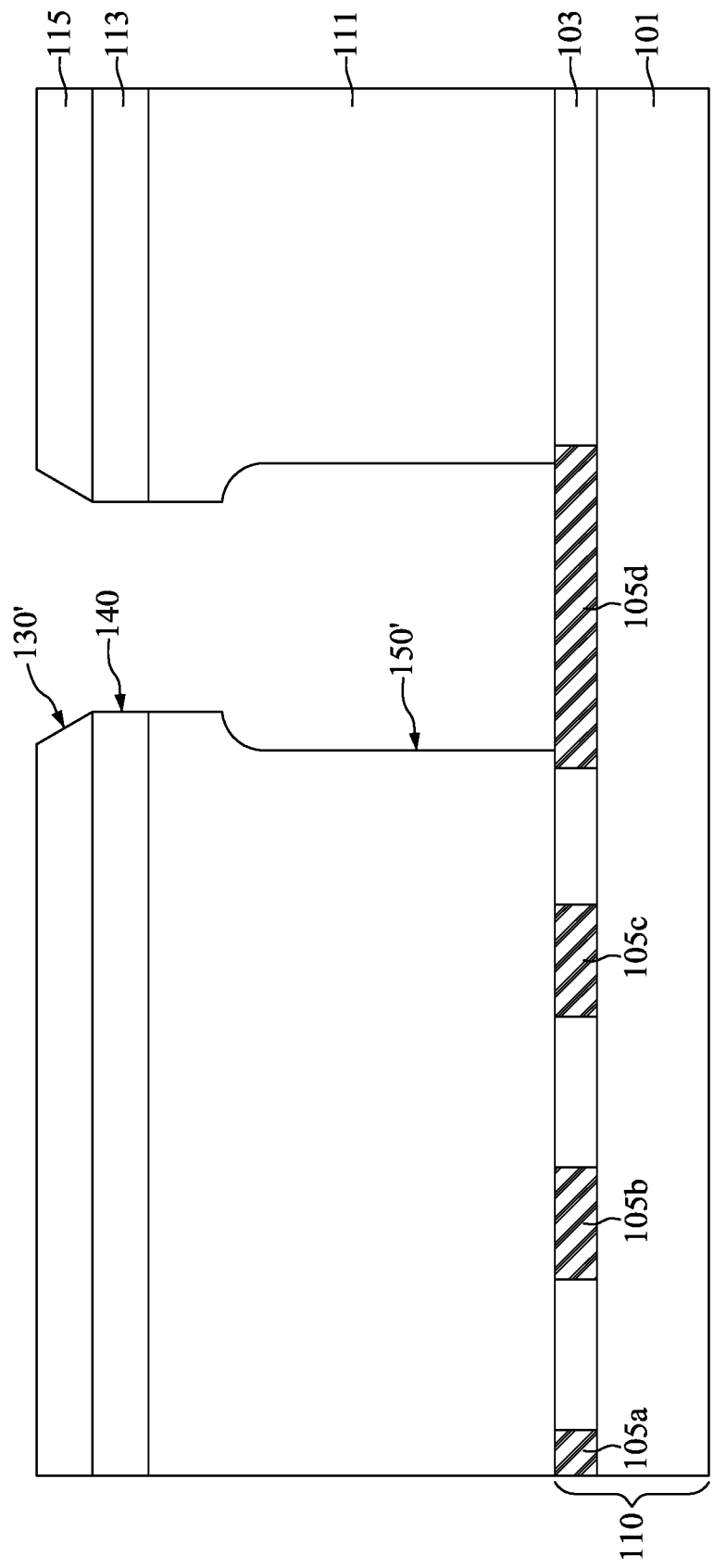
FIG. 13 is a cross-sectional view illustrating an intermediate stage of removing the protective layer during the formation of the semiconductor device structure, in accordance with some embodiments.

After the enlarged opening 150' is formed, the protective layer 161 is removed, as shown in FIG. 13 in accordance with some embodiments. The respective step is illustrated as the step S25 in the method 10 shown in FIG. 5. The protective layer 161 may be removed by a wet etching process, a dry etching process, or a combination thereof. In some embodiments, an etching solution including phosphoric acid ($H_3PO_4$) is used to remove the protective layer 161.

Figure 14:
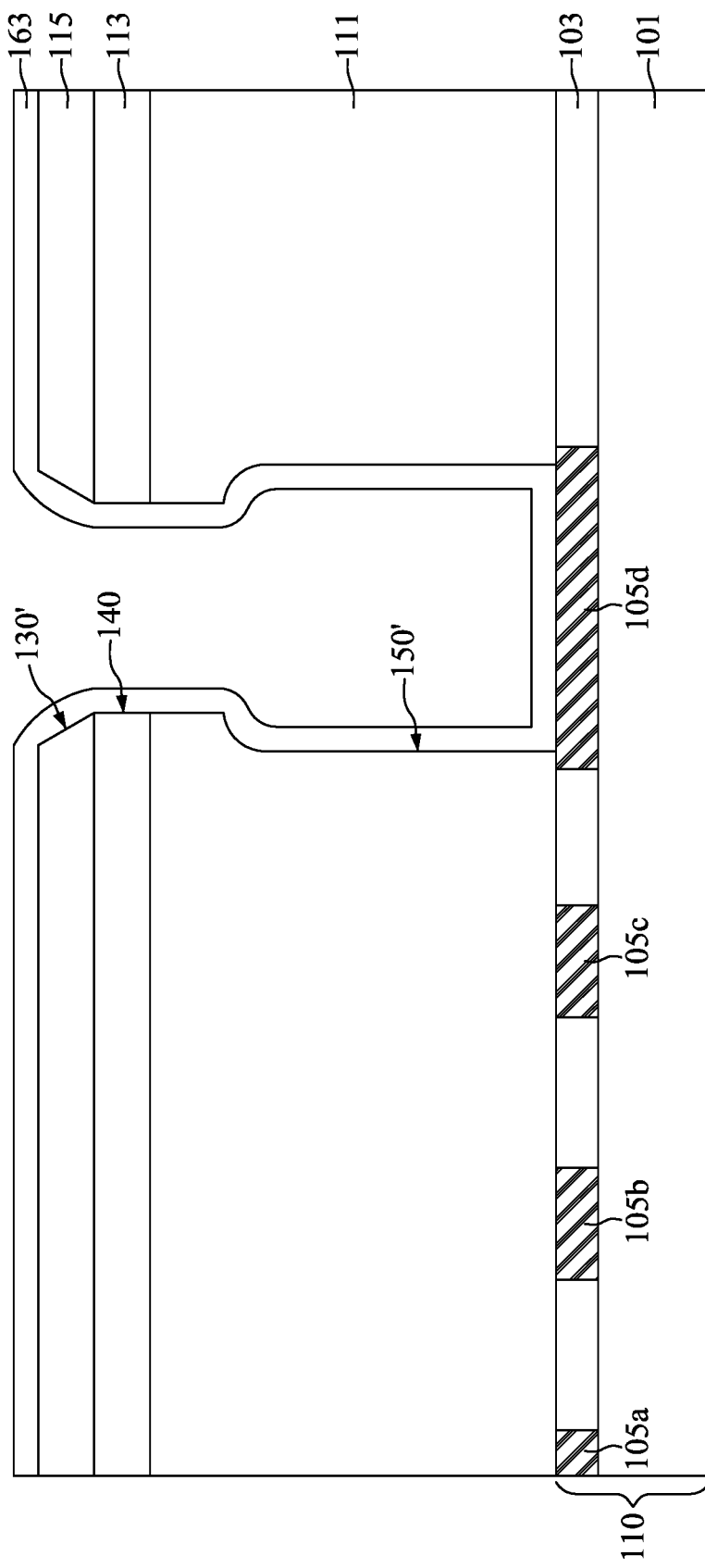
FIG. 14 is a cross-sectional view illustrating an intermediate stage of forming a lining material in the openings of the first mask layer, the second mask layer and the silicon layer during the formation of the semiconductor device structure, in accordance with some embodiments.

Next, a lining material 163 is formed over the second mask layer 115 and covering the sidewalls of the opening 130', the sidewalls of the opening 140, the sidewalls and the bottom surface of the opening 150', as shown in FIG. 14 in accordance with some embodiments. In other words, the inclined sidewalls of the second mask layer 115, the sidewalls of the first mask layer 113, the sidewalls of the silicon layer 111, and the exposed surface of the conductive pad 105d are covered by the lining material 163.

The lining material 163 is conformally deposited over the structure of FIG. 13, and the lining material 163 is used to separate the subsequently formed conductive layers from the silicon layer 111. In some embodiments, the lining material 163 is made of silicon oxide, tetraethylorthosilicate (TEOS) oxide, silicon nitride, polyimide, another applicable dielectric material, or a combination thereof. Moreover, the lining material 163 may be formed by a thermal oxidation process, a CVD process, a PVD process, or another applicable deposition process.

Figure 15:
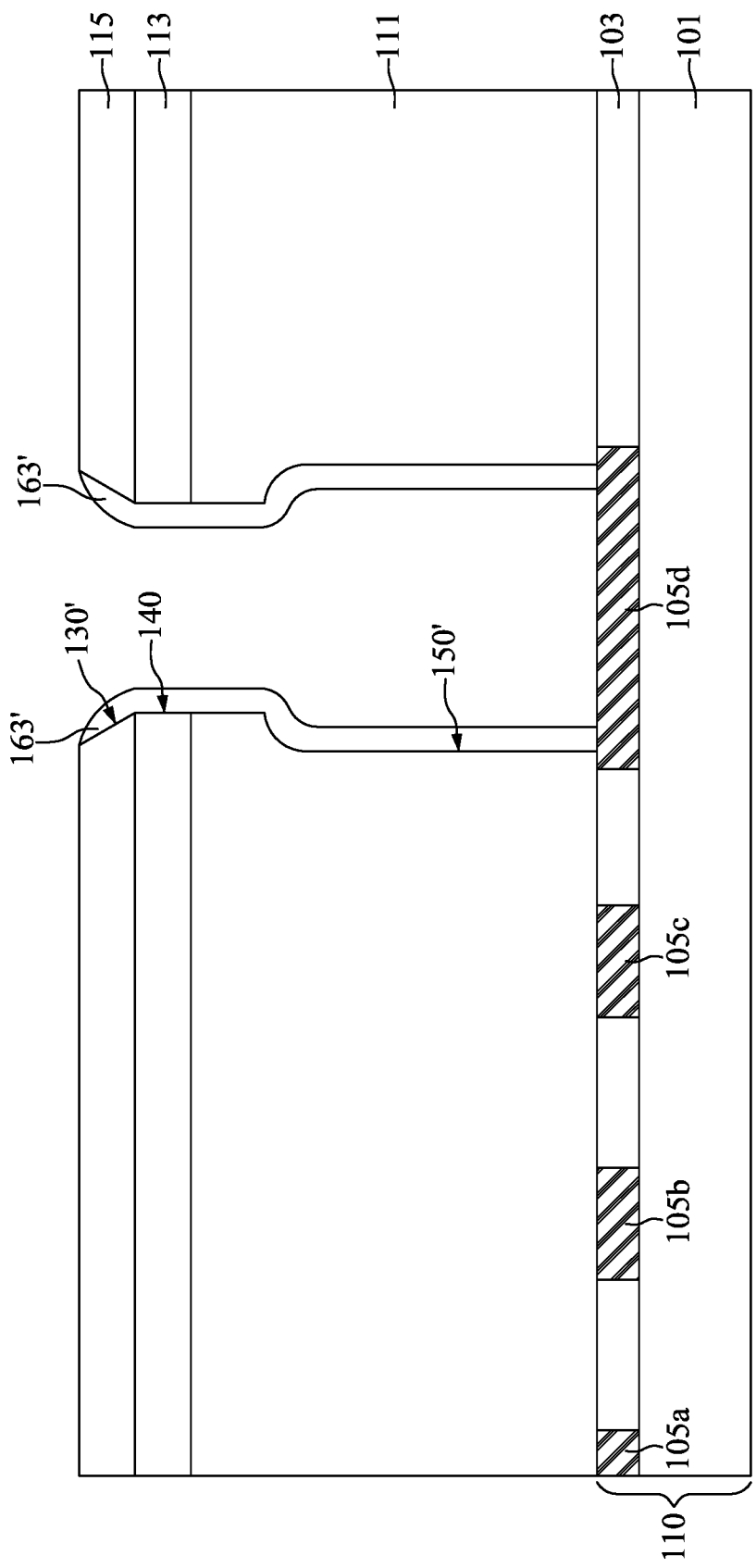
FIG. 15 is a cross-sectional view illustrating an intermediate stage of etching the lining material to form a lining layer during the formation of the semiconductor device structure, in accordance with some embodiments.

Then, an anisotropic etching process is performed on the lining material 163 to remove the same amount of the lining material 163 vertically in all places, leaving the lining layer 163' on the sidewalls of the openings 130', 140 and 150', as shown in FIG. 15 in accordance with some embodiments. The anisotropic etching process performed on the lining material 163 may be a dry etching process. After the anisotropic etching process is performed, the conductive pad 105d is exposed by the openings 150', 140 and 130', in accordance with some embodiments.

Figure 16:
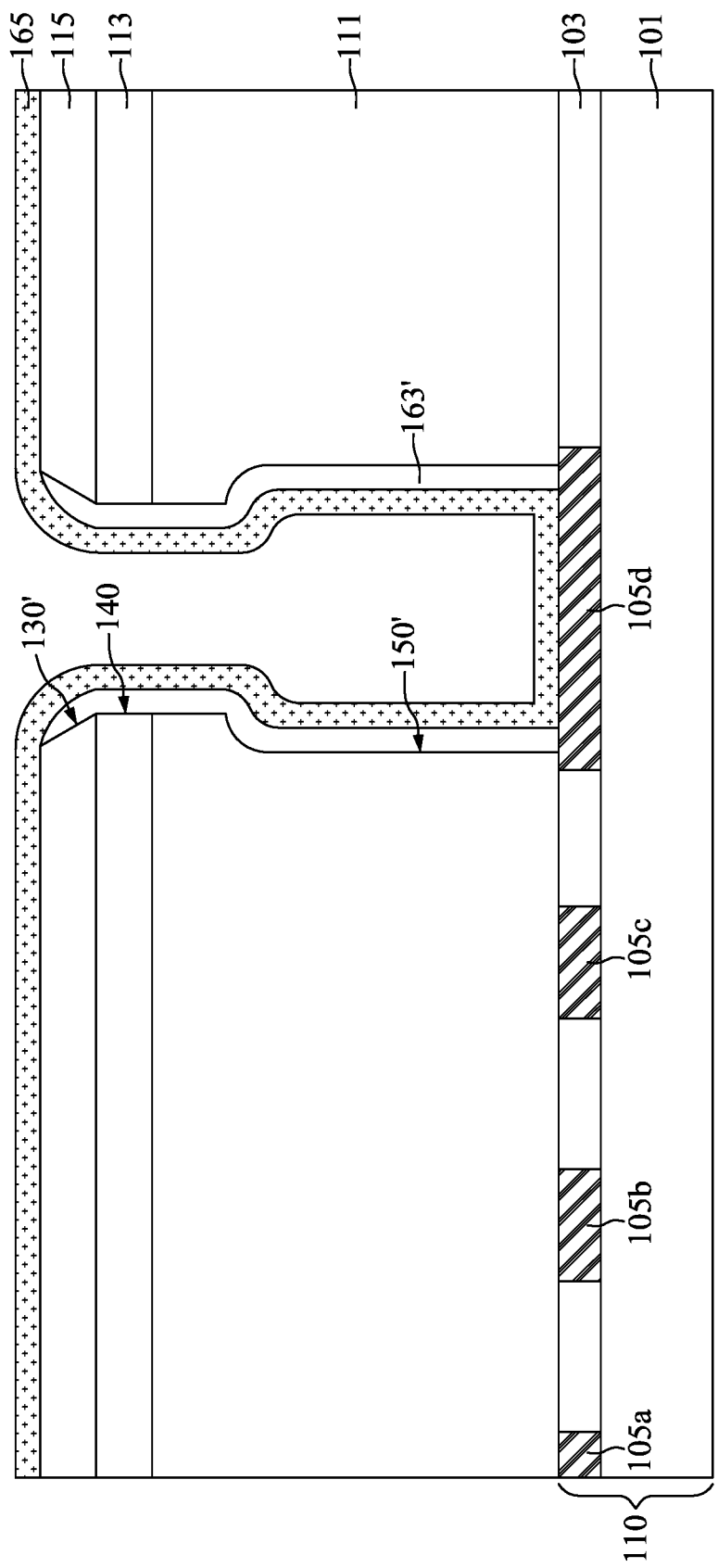
FIG. 16 is a cross-sectional view illustrating an intermediate stage of forming a barrier material over the lining layer during the formation of the semiconductor device structure, in accordance with some embodiments.

Subsequently, a barrier material 165 is formed over the second mask layer 115 and the lining layer 163', as shown in FIG. 16 in accordance with some embodiments. In some embodiments, the exposed surface of the conductive pad 105d is covered by the barrier material 165. The barrier material 165 functions as a diffusion barrier to prevent metal diffusion and as an adhesion layer between the lining layer 163' and the subsequently formed conductive material. In some embodiments, the barrier material 165 includes TaN, Ta, Ti, TiN, TiSiN, WN, CoW, or a combination thereof. The barrier material 165 may be formed by a CVD process, a PVD process, a sputtering process, or another applicable process.

Figure 17:
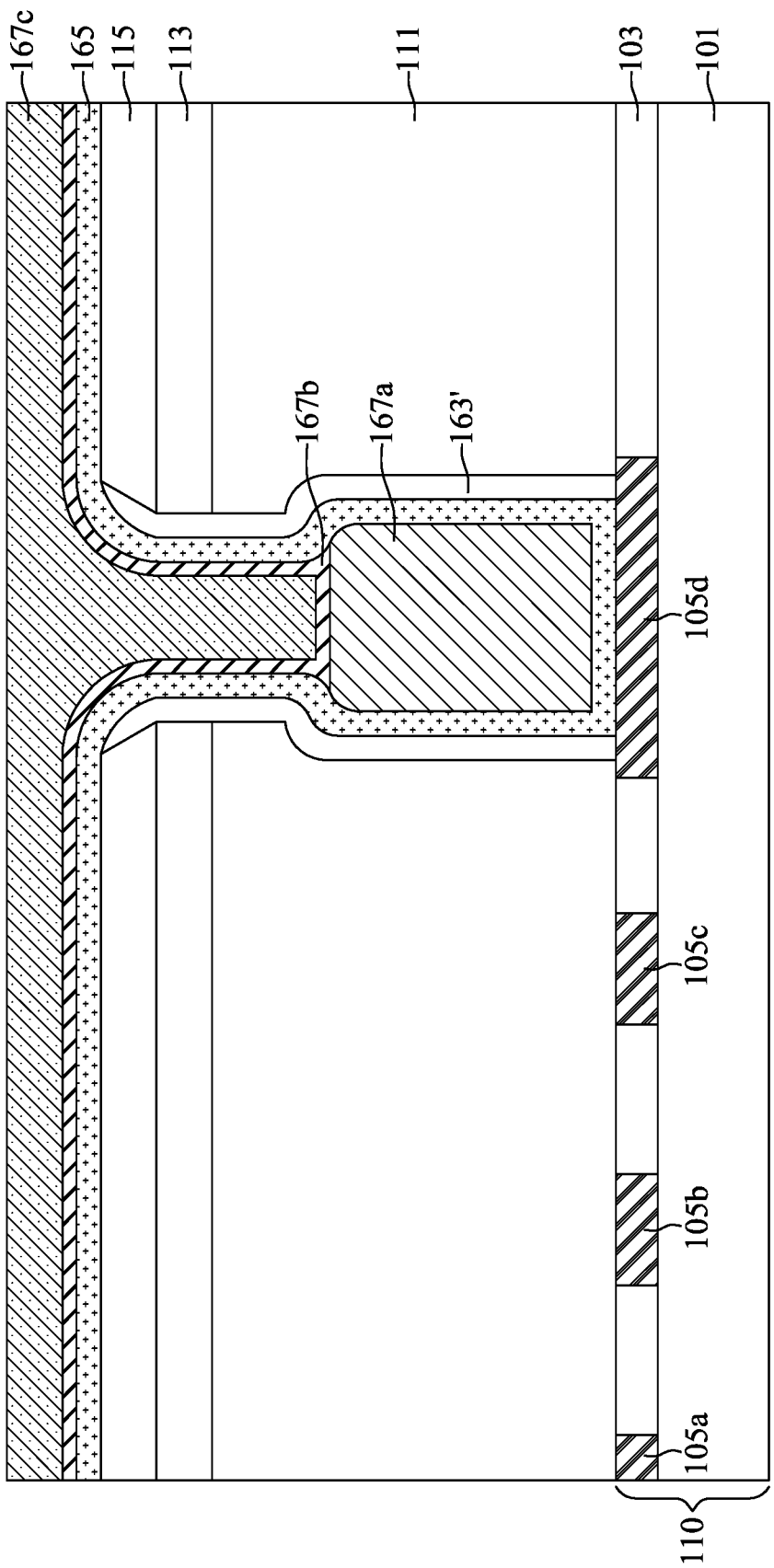
FIG. 17 is a cross-sectional view illustrating an intermediate stage of forming a conductive material over the barrier material during the formation of the semiconductor device structure, in accordance with some embodiments.

Then, a lower conductor layer 167a is formed over the barrier material 165 in the bottle-shaped opening 150', a graphene layer 167b is formed over the lower conductor 167a, and an upper conductor layer 167c is formed over the graphene layer 167b, as shown in FIG. 17 in accordance with some embodiments. In some embodiments, the remaining portions of the openings 130', 140 and 150' are filled by the lower conductor layer 167a, the graphene layer 167b, and the upper conductor layer 167c. Before the lower conductor layer 167a is formed, a seed layer (not shown) may be formed over the barrier material 165.

The seed layer may be a copper seed layer and may be formed by a CVD process, a PVD process, a sputtering process, a plating process, or another applicable process. In some embodiments, the lower conductor layer 167a and the upper conductor layer 167c include a low resistivity conductive material, such as copper (Cu). In some other embodiments, the conductive material 167 includes tungsten (W), aluminum (Al), titanium (Ti), tantalum (Ta), gold (Au), silver (Ag), a combination thereof, or another applicable conductive material. The lower conductor layer 167a and the upper conductor layer 167c may be formed by a CVD process, a PVD process, a sputtering process, a plating process, or another applicable process.

Figure 18:
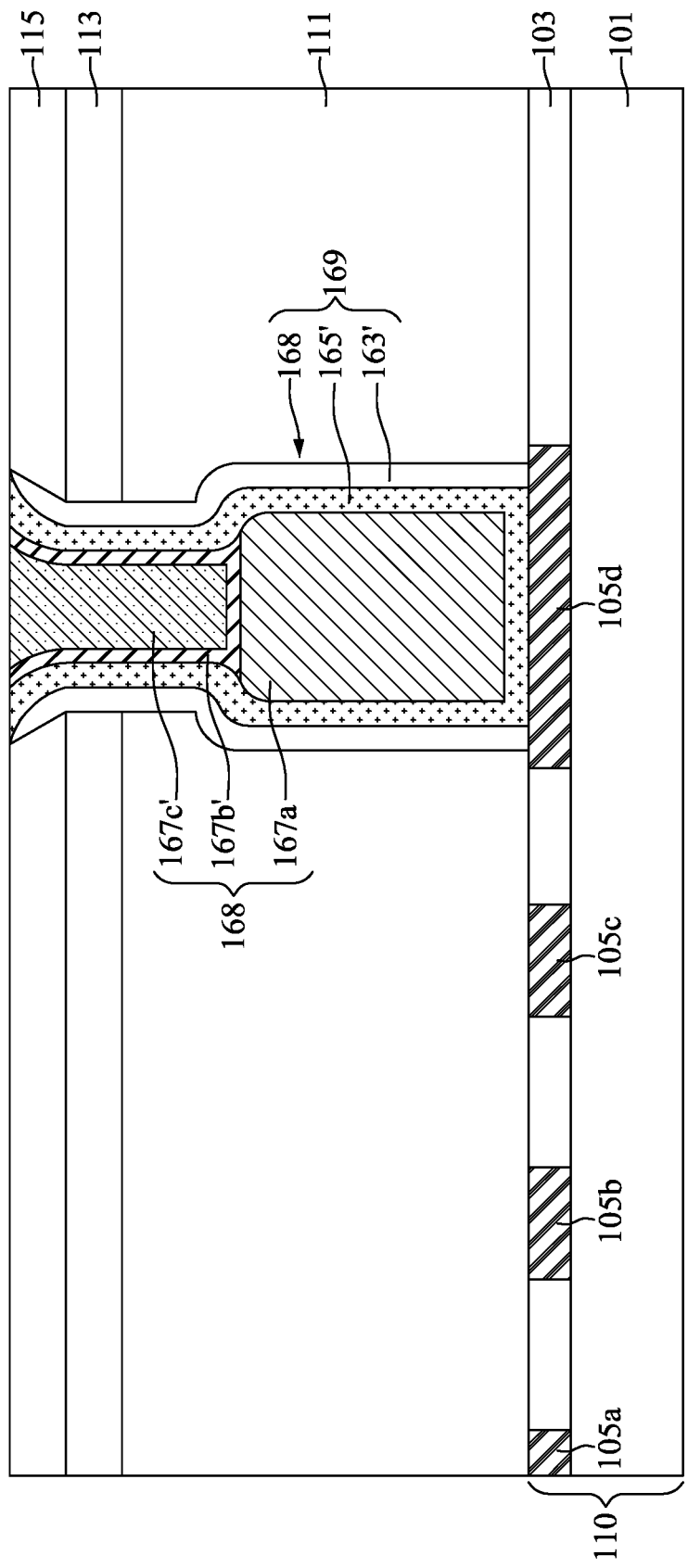
FIG. 18 is a cross-sectional view illustrating an intermediate stage of planarizing the conductive material and the barrier material to form a through silicon via during the formation of the semiconductor device structure, in accordance with some embodiments.

After the upper conductor layer 167c is formed, a planarization process is performed to form the composite through silicon via 169, and the composite through silicon via 169 includes the lining layer 163', the barrier layer 165' and a composite conductor 168, as shown in FIG. 18 in accordance with some embodiments. In some embodiments, the composite through silicon via 169 includes a lower conductor 167a, a graphene layer 167b' on the lower conductor and an upper conductor 167c' in the graphene layer 167b'. The planarization process may include a chemical mechanical polishing (CMP) process, which removes the excess portions of the upper conductor layer 167c, the graphene layer 167b and the barrier material 165 over the second mask layer 115. The respective step is illustrated as the step S27 in the method 10 shown in FIG. 5.

Next, the second semiconductor die 180 is formed over the second mask layer 115, as shown in FIG. 1 in accordance with some embodiments. The respective step is illustrated as the step S29 in the method 10 shown in FIG. 5. In some embodiments, the second semiconductor die 180 is bonded to the structure of FIG. 17 such that the conductive pads 175a, 175b, 175c, 175d and 175e face the composite through silicon via 169. After the second semiconductor die 180 is formed, the semiconductor device structure 100 is obtained.

Similar to the first semiconductor die 110, the second semiconductor die 180 may be a portion of an IC chip that includes various passive and active microelectronic devices, and the second semiconductor die 180 may include various material layers configured to form IC features. In some embodiments, the composite through silicon via 169 electrically connects the conductive pad 105d of the first semiconductor die 110 and the conductive pad 175d of the second semiconductor die 180. Since the second semiconductor die 180 is formed after the composite through silicon via 169, the risk of damaging the conductive pads 175a, 175b, 175c, 175d and 175e in the second semiconductor die 180 during the processes for forming the composite through silicon via 169 may be reduced.

Figure 19:
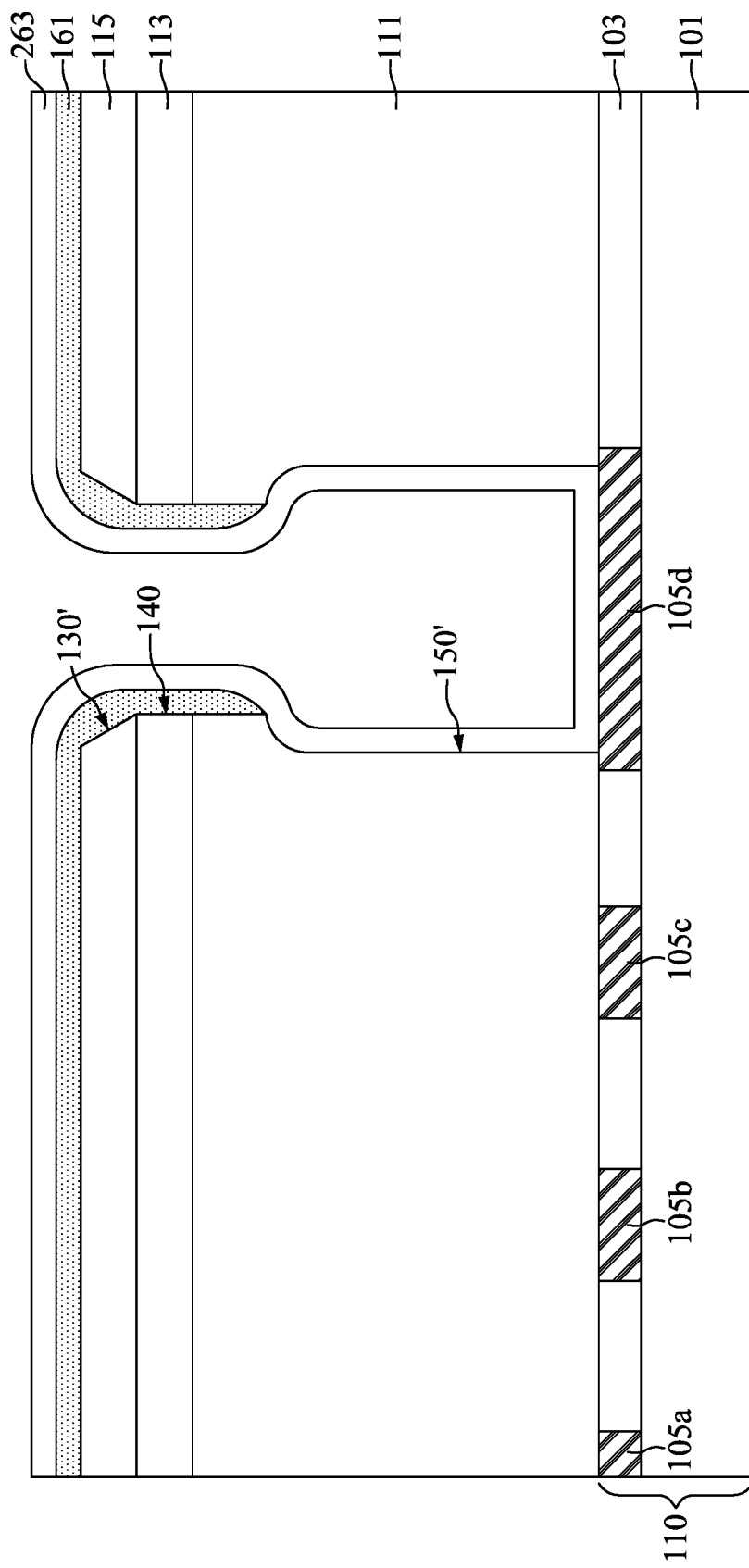
FIG. 19 is a cross-sectional view illustrating an intermediate stage of forming a lining material over the protective layer during the formation of the modified semiconductor device structure, in accordance with some embodiments.

FIGS. 19 to 23 are cross-sectional views illustrating intermediate stages of forming the semiconductor device structure 200, in accordance with some embodiments. After the silicon layer 111 is etched by using the protective layer 161 as a mask (i.e., following the step of FIG. 12), a lining material 263 is formed over the protective layer 161, as shown in FIG. 19 in accordance with some embodiments. Some materials and processes used to form the lining material 263 are similar to, or the same as those used to form the lining material 163 of FIG. 14, and details thereof are not repeated herein.

Figure 20:
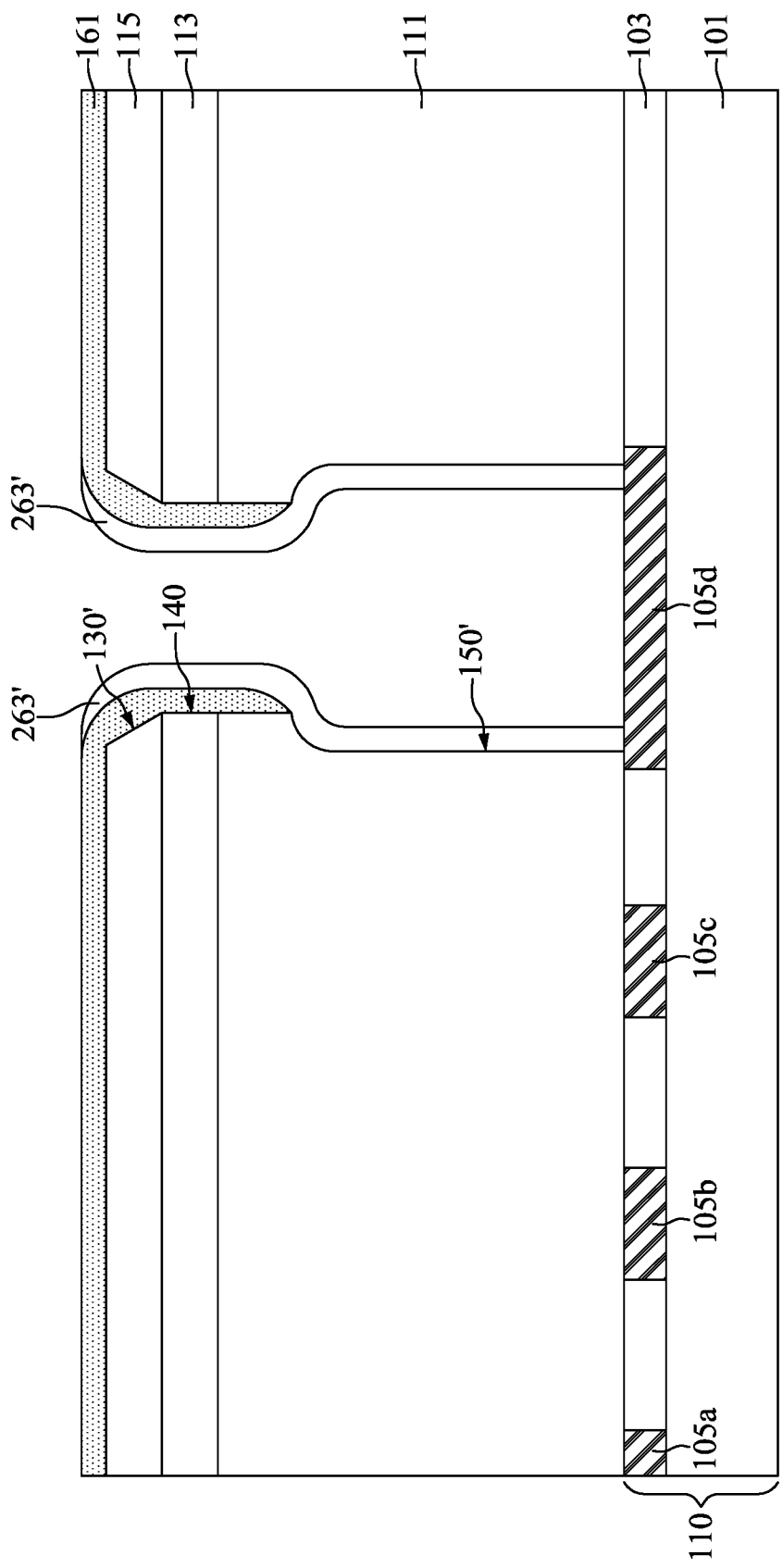
FIG. 20 is a cross-sectional view illustrating an intermediate stage of etching the lining material to form a lining layer during the formation of the modified semiconductor device structure, in accordance with some embodiments.

Next, an anisotropic etching process is performed on the lining material 263 to remove the same amount of the lining material 263 vertically in all places, leaving the lining layer 263' on the sidewalls of the openings 130', 140 and 150', as shown in FIG. 20 in accordance with some embodiments. The anisotropic etching process performed on the lining material 263 may be a dry etching process. After the anisotropic etching process is performed, the conductive pad 105d is exposed by the openings 150', 140 and 130', in accordance with some embodiments.

Figure 21:
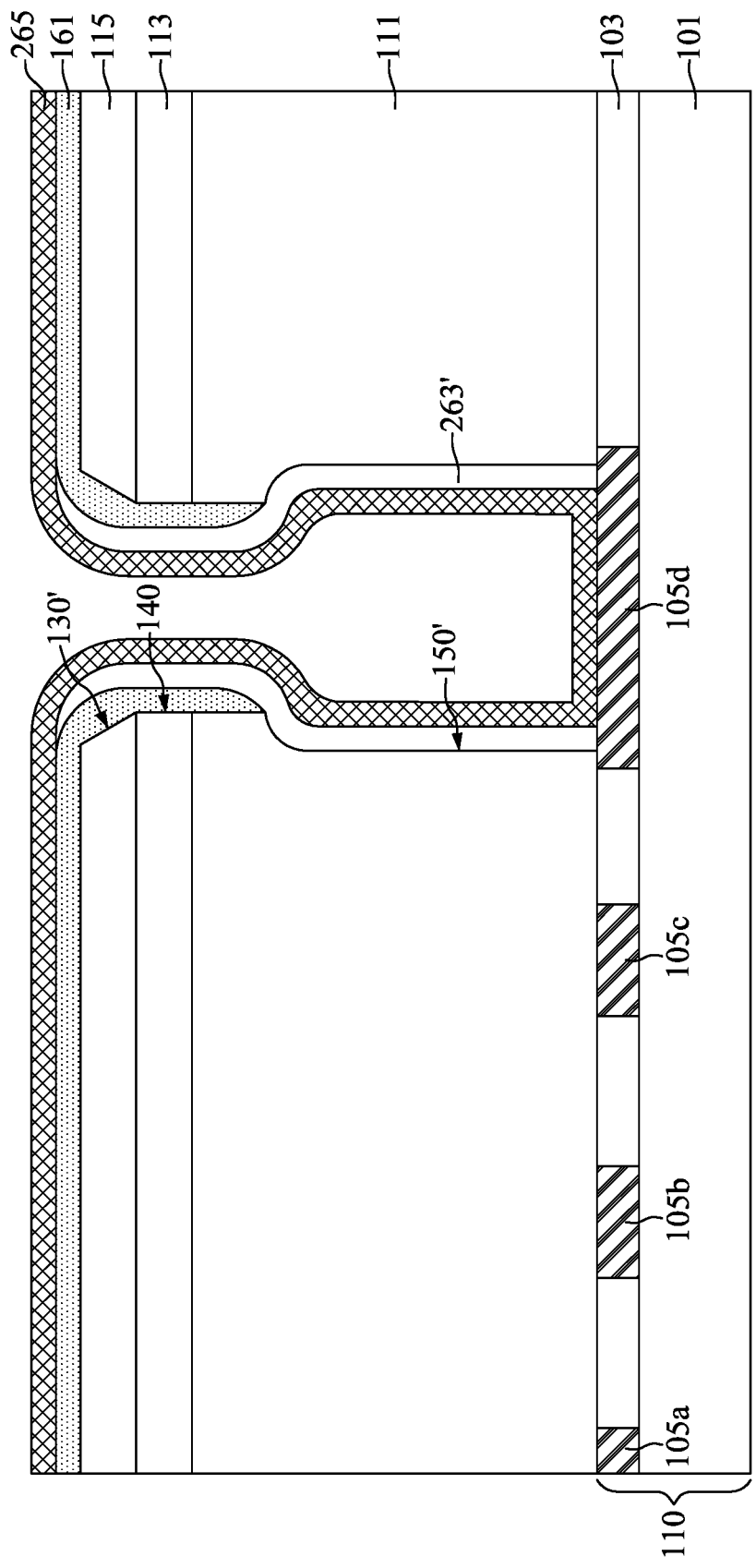
FIG. 21 is a cross-sectional view illustrating an intermediate stage of forming a barrier material over the lining layer during the formation of the modified semiconductor device structure, in accordance with some embodiments.

Subsequently, a barrier material 265 is formed over the protective layer 161 and the lining layer 263', as shown in FIG. 21 in accordance with some embodiments. Some materials and processes used to form the barrier material 265 are similar to, or the same as those used to form the barrier material 165 of FIG. 16, and details thereof are not repeated herein.

Figure 22:
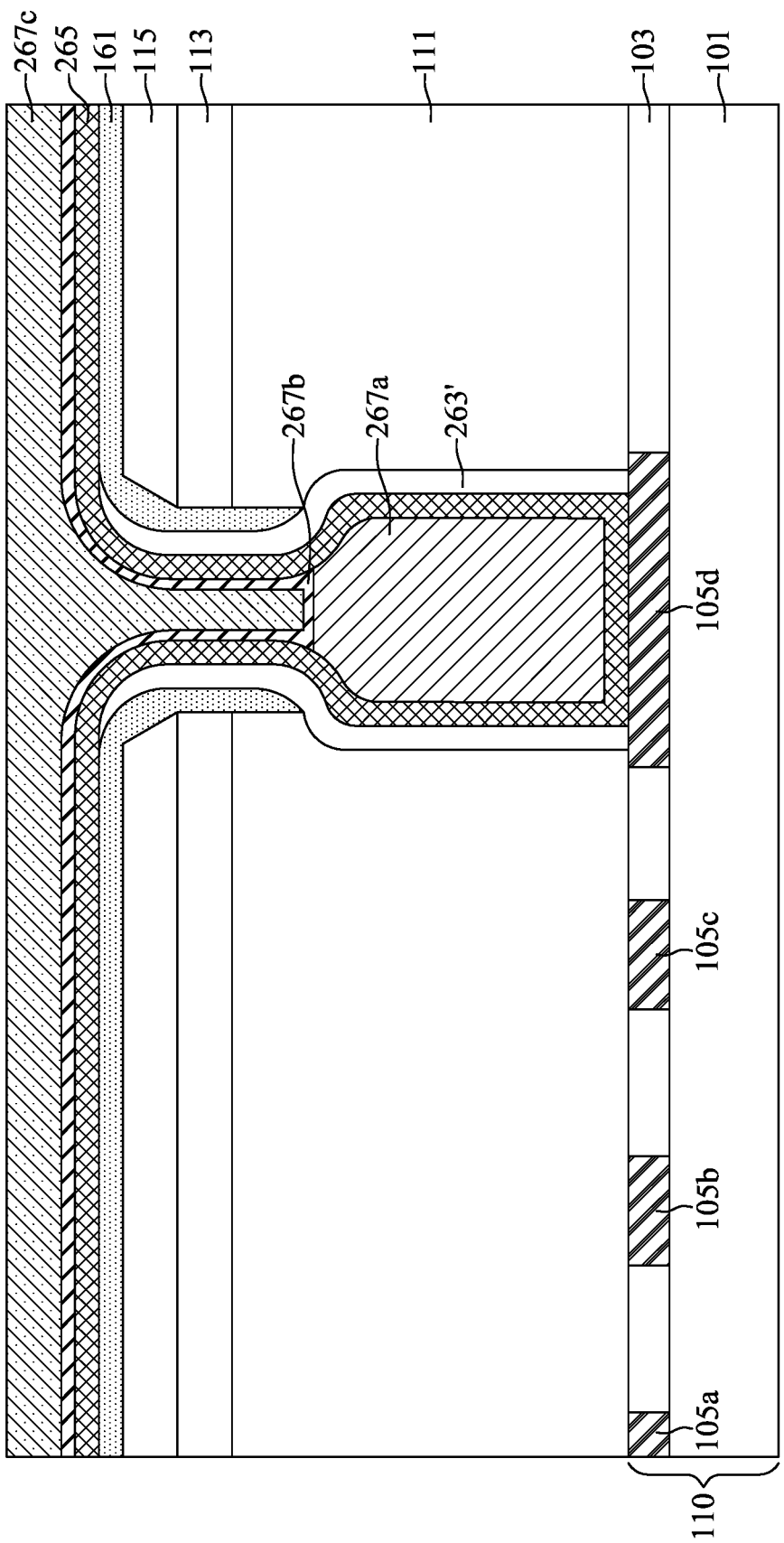
FIG. 22 is a cross-sectional view illustrating an intermediate stage of forming a conductive material over the barrier material during the formation of the modified semiconductor device structure, in accordance with some embodiments.

Then, a lower conductor layer 267a is formed over the barrier material 165 in the bottle-shaped opening 150', a graphene layer 267b is formed over the lower conductor 267a, and an upper conductor layer 267c is formed over the graphene layer 267b, as shown in FIG. 22 in accordance with some embodiments. In some embodiments, the remaining portions of the openings 130', 140 and 150' are filled by the lower conductor layer 267a, the graphene layer 267b, and the upper conductor layer 267c. Before the lower conductor layer 267a is formed, a seed layer (not shown) may be formed over the barrier material 265. Some materials and processes used to form the lower conductor layer 267a are similar to, or the same as those used to form the lower conductor layer 167a of FIG. 17, and details thereof are not repeated herein.

Figure 23:
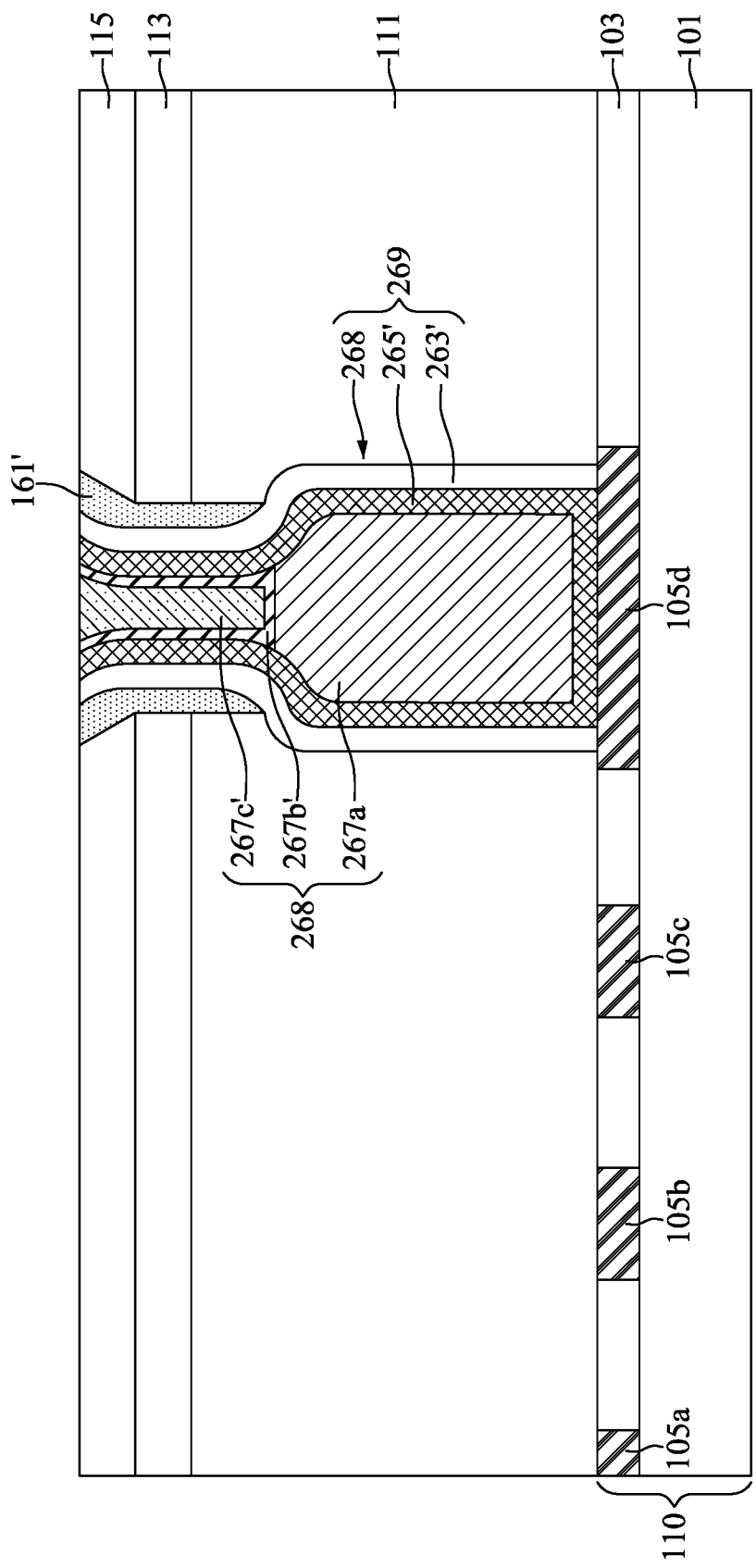
FIG. 23 is a cross-sectional view illustrating an intermediate stage of planarizing the conductive material and the barrier material to form a through silicon via during the formation of the modified semiconductor device structure, in accordance with some embodiments.

After the upper conductor layer 267c is formed, a planarization process is performed on the upper conductor layer 267c, the barrier material 265 and the protective layer 161 to form the composite through silicon via 269 and a remaining portion of the protective layer 161', as shown in FIG. 23 in accordance with some embodiments. The composite through silicon via 269 includes the lining layer 263', the barrier layer 265' and a composite conductor 268. In some embodiments, the composite conductor 268 includes a lower conductor 267a, a graphene layer 267b' on the lower conductor 267a and an upper conductor 267c' in the graphene layer 267b'. The planarization process may include a CMP process, which removes the excess portions of the upper conductor layer 267c, the graphene layer 267b, the barrier material 265 and the protective layer 161 over the second mask layer 115.

Next, the second semiconductor die 180 is formed over the second mask layer 115, as shown in FIG. 3 in accordance with some embodiments. In some embodiments, the second semiconductor die 180 is bonded to the structure of FIG. 23 such that the conductive pads 175a, 175b, 175c, 175d and 175e face the composite through silicon via 269. In some embodiments, the protective layer 161' is in direct contact with the second semiconductor die 180. After the second semiconductor die 180 is formed, the semiconductor device structure 200 is obtained.

In some embodiments, the composite through silicon via 269 electrically connects the conductive pad 105d of the first semiconductor die 110 and the conductive pad 175d of the second semiconductor die 180. Since the second semiconductor die 180 is formed after the composite through silicon via 269, the risk of damaging the conductive pads 175a, 175b, 175c, 175d and 175e in the second semiconductor die 180 during the processes for forming the composite through silicon via 269 may be reduced.

Embodiments of the semiconductor device structures 100 and 200 are provided in the disclosure. In some embodiments, the through silicon vias 169 and 269 penetrating through the silicon layer 111, the first mask layer 113 and the second mask layer 115 are formed to electrically connect the first semiconductor die 110 and the second semiconductor die 180 in vertical direction. The through silicon vias 169 and 269 have bottle-shaped profiles. For example, the bottom surface 169B of the composite through silicon via 169 is greater than the top surface 169T of the composite through silicon via 169, and the top surface 169T of the composite through silicon via 169 is greater than a cross-section (e.g., the cross-section CS) of the composite through silicon via 169 between and parallel to the top surface 169T and the bottom surface 169B of the composite through silicon via 169. Therefore, the through silicon vias 169 and 269 can be used to electrically connect the first semiconductor die 110 and the second semiconductor die 180, which have different design rules (e.g., different pattern densities or different critical dimensions). As a result, functional density (i.e., the number of interconnected devices per chip area) may be increased, providing benefits such as increased production efficiency, lowered costs, and improved performance.

In one embodiment of the present disclosure, a semiconductor device is provided. The semiconductor device structure includes a silicon layer disposed over a first semiconductor die, and a first mask layer disposed over the silicon layer. The semiconductor device structure also includes a second semiconductor die disposed over the first mask layer, and a through silicon via penetrating through the silicon layer and the first mask layer. A bottom surface of the through silicon via is greater than a top surface of the through silicon via, and the top surface of the through silicon via is greater than a cross-section of the through silicon via between and parallel to the top surface and the bottom surface of the through silicon via.

In another embodiment of the present disclosure, a semiconductor device is provided. The semiconductor device structure includes a silicon layer disposed over a first semiconductor die, and a first mask layer disposed over the silicon layer. The semiconductor device structure also includes a second mask layer disposed over the first mask layer, and a second semiconductor die disposed over the second mask layer. The semiconductor device structure further includes a through silicon via penetrating through the silicon layer, the first mask layer and the second mask layer to electrically connect the first semiconductor die and the second semiconductor die. The through silicon via has a bottle-neck shaped portion surrounded by the first mask layer and an upper portion of the silicon layer, and an interface area between the through silicon via and the first semiconductor die is greater than an interface area between the through silicon via and the second semiconductor die.

In yet another embodiment of the present disclosure, a method for preparing a semiconductor device is provided. The method includes forming a silicon layer over a first semiconductor die, and forming a first mask layer over the silicon layer. The method also includes forming a first opening penetrating through the first mask layer and forming a second opening penetrating through the silicon layer, and depositing a protective layer over the first mask layer. The protective layer extends to cover a sidewall of the first mask layer and an upper sidewall of the silicon layer. The method further includes etching the silicon layer by using the protective layer as a mask to undercut an upper portion of the silicon layer such that an enlarged second opening is formed. In addition, the method includes filling the first opening and the enlarged second opening with a through silicon via, and forming a second semiconductor die over the through silicon via.

The embodiments of the present disclosure have some advantageous features. By forming a through silicon via having a bottle-shaped profile, the through silicon via can be used to electrically connect two semiconductor dies (or semiconductor wafers) with different design rules in the vertical direction. As a result, production efficiency may be increased, costs may be lowered, and performance may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
   a silicon layer disposed over a first semiconductor die;
   a first mask layer disposed over the silicon layer;
   a second semiconductor die disposed over the first mask layer; and
   a through silicon via penetrating through the silicon layer and the first mask layer;
   wherein the through silicon via includes a lower conductor, a graphene layer disposed on the lower conductor and an upper conductor disposed in the graphene layer;
   wherein a bottom surface of the through silicon via is greater than a top surface of the through silicon via, and the top surface of the through silicon via is greater than a cross-section of the through silicon via between and parallel to the top surface and the bottom surface of the through silicon via;
   wherein the through silicon via comprises:
   a conductive layer; and
   a barrier layer covering sidewalls and a bottom surface of the conductive layer, wherein the barrier layer is in direct contact with the first semiconductor die.

2. The semiconductor device structure of claim 1, wherein the lower conductor of the through silicon via is in direct contact with a first conductive pad in the first semiconductor die, and the upper conductor is in direct contact with a second conductive pad in the second semiconductor die.

3. The semiconductor device structure of claim 2, further comprising:
   a third conductive pad disposed in the first semiconductor die and adjacent to the first conductive pad; and
   a fourth conductive pad disposed in the second semiconductor die and adjacent to the second conductive pad, wherein a lateral distance between the third conductive pad and the first conductive pad in the first semiconductor die is greater than a lateral distance between the fourth conductive pad and the second conductive pad in the second semiconductor die.

4. The semiconductor device structure of claim 1, further comprising:
   a second mask layer disposed between the first mask layer and the second semiconductor die, wherein the through silicon via penetrates through the second mask layer, and wherein the first mask layer and the second mask layer are made of different materials.

5. The semiconductor device structure of claim 4, wherein a sidewall of the second mask layer is inclined relative to a sidewall of the first mask layer.

6. The semiconductor device structure of claim 5, further comprising:
   a protective layer covering the sidewall of the second mask layer, the sidewall of the first mask layer and an upper sidewall of the silicon layer, wherein the upper sidewall of the silicon layer is substantially aligned with the sidewall of the first mask layer.

7. The semiconductor device structure of claim 6, wherein the through silicon via comprises a lining layer covering sidewalls of the barrier layer.

8. A semiconductor device structure, comprising:
a silicon layer disposed over a first semiconductor die;
a first mask layer disposed over the silicon layer;
a second mask layer disposed over the first mask layer;
a second semiconductor die disposed over the second mask layer; and
a through silicon via penetrating through the silicon layer, the first mask layer and the second mask layer to electrically connect the first semiconductor die and the second semiconductor die;
wherein the through silicon via includes a lower conductor, a graphene layer disposed on the lower conductor and an upper conductor disposed in the graphene layer;
wherein the through silicon via has a bottle-neck shaped portion surrounded by the first mask layer and an upper portion of the silicon layer, and an interface area between the through silicon via and the first semiconductor die is greater than an interface area between the through silicon via and the second semiconductor die;
wherein the through silicon via comprises:
a conductive layer; and
a barrier layer covering sidewalls and a bottom surface of the conductive layer, wherein the barrier layer is in direct contact with the first semiconductor die.

9. The semiconductor device structure of claim 8, wherein the first semiconductor die has a first critical dimension, and the second semiconductor die has a second critical dimension, and the first critical dimension is greater than the second critical dimension.

10. The semiconductor device structure of claim 8, wherein the through silicon via further comprises:
a top portion surrounded by the second mask layer; and
a bottom portion surrounded by a lower portion of the silicon layer,
wherein the bottle-neck shaped portion of the through silicon via is sandwiched between the top portion and the bottom portion of the through silicon via, and the top portion of the through silicon via has a tapered profile tapering toward the bottle-neck shaped portion of the through silicon via.

11. The semiconductor device of claim 10, wherein the bottom portion of the through silicon via has rounded and convex top corners.

12. The semiconductor device structure of claim 10, wherein the bottle-neck shaped portion and the top portion of the through silicon via are separated from the first mask layer, the second mask layer and the upper portion of the silicon layer by a protective layer.

13. The semiconductor device structure of claim 12, wherein the bottom portion of the through silicon via is in direct contact with the lower portion of the silicon layer.

14. The semiconductor device structure of claim 12, wherein the protective layer comprises aluminum oxide.

* * * * *